(12) United States Patent
Bae et al.

(10) Patent No.: US 8,497,718 B2
(45) Date of Patent: *Jul. 30, 2013

(54) DATA TRANSFER CIRCUIT AND METHOD WITH COMPENSATED CLOCK JITTER

(75) Inventors: Seung Jun Bae, Hwaseong-si (KR); Kwang Il Park, Yongin-si (KR); Young-Sik Kim, Gunpo-si (KR); Sang Hyup Kwak, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/613,342

(22) Filed: Sep. 13, 2012

(65) Prior Publication Data

US 2013/0009685 A1    Jan. 10, 2013

Related U.S. Application Data

(63) Continuation of application No. 12/754,794, filed on Apr. 6, 2010, now Pat. No. 8,269,537.

(30) Foreign Application Priority Data

Apr. 8, 2009  (KR) .............................. 2009-0030502

(51) Int. Cl.
*H03L 7/00*    (2006.01)

(52) U.S. Cl.
USPC ........................................... 327/161; 327/564

(58) Field of Classification Search
USPC .................. 327/161, 334, 365, 379, 524, 564
See application file for complete search history.

(56) References Cited

U.S. PATENT DOCUMENTS

| 5,955,929 | A | 9/1999 | Moon et al. |
| 6,657,503 | B2 | 12/2003 | Liu |
| 7,206,368 | B2 | 4/2007 | Engel et al. |
| 2009/0033392 | A1 | 2/2009 | Kim |
| 2012/0087452 | A1 | 4/2012 | Zerbe et al. |

FOREIGN PATENT DOCUMENTS

KR    1020050113969 A    12/2005

*Primary Examiner* — William Hernandez
(74) *Attorney, Agent, or Firm* — Volentine & Whitt, PLLC

(57) ABSTRACT

A data I/O interface for an integrated circuit device includes a noise detector receiving a power supply voltage, detecting a power supply voltage noise component, and providing a clock delay control signal in response to detected power supply voltage noise component. The data I/O interface also includes a clock delay circuit providing a delayed clock signal in response to the clock delay control signal, and a data transfer circuit powered by the power supply voltage and providing output data synchronously with the delayed clock signal.

16 Claims, 24 Drawing Sheets

When Freq($V_{CDC\_A}$) < $1/(2\pi R_3 C_3)$

When Freq($V_{CDC\_A}$) ≥ $1/(2\pi R_3 C_3)$

When Freq(Vp) < $1/(2\pi RC)$

When Freq(Vp) ≥ $1/(2\pi RC)$

DATA TRANSFER CIRCUIT AND METHOD WITH COMPENSATED CLOCK JITTER

CROSS-REFERENCE TO RELATED APPLICATION

This is a Continuation of application Ser. No. 12/754,794, filed Apr. 6, 2010, which is a U.S. non-provisional patent application claims priority under 35 U.S.C. §119 to Korean Patent Application No. 2009-0030502 filed Apr. 8, 2009, the subject matter of which is hereby incorporated by reference.

BACKGROUND

The present inventive concept is generally related to data transfer circuits, integrated circuit devices incorporating data transfer circuits, and methods controlling the operation of a data transfer circuit that compensates for clock signal jitter arising as a function of power supply voltage variations.

As greater data bandwidth and enhanced functionality are increasingly demanded of integrated circuit devices, the transmission frequency for data received by and transmitted from such devices has increased. Increasing data input/output (I/O) frequencies causes many problems since conventional circuits are generally ill-adapted to function at such frequencies. For example, as data passes through certain data transfer circuits at higher and higher speeds, the tolerance of the data transfer circuit to variations in applied control signals and control voltages is diminished.

FIG. 1 is a block diagram of a generic data transfer circuit 100. The data transfer circuit 100 may take many different forms within a variety of integrated circuit devices, such as (e.g.) a data I/O interface for a semiconductor memory device. Within this exemplary context, as the operating frequency of a semiconductor memory device rises, the rate at which data passes through the I/O interface during read/write operations also increases.

As illustrated in FIG. 1, the data transfer circuit 100 essentially receives as inputs; a clock signal (CLK), a power supply voltage (Vp), and a data input signal (Din). In its operation, the data transfer circuit 100 provides output data (Dout) having the same information content as the input data (Din) synchronously with the clock signal (CLK). The information content of the output data (Dout) should be exactly the same as the input data (Din), albeit potentially retimed as an output from the data transfer circuit 100 so to be synchronously related to the clock signal (CLK).

Any particular design of the data transfer circuit 100 assumes a fixed value (i.e., a constant level) for the applied power supply voltage (Vp). Depending on the nature and application of the data transfer circuit 100, the power supply voltage (Vp) may take one of many different forms and be set at any reasonable level. For example, a voltage commonly generated within or applied to contemporary integrated circuit devices, such as $V_{DD}$, $V_{SS}$, $V_{DDQ}$, $V_{SSQ}$, $V_{DDL}$, and $V_{DDH}$, may be used as a power supply voltage (Vp) applied to the data transfer circuit 100.

However defined, the power supply voltage (Vp) is expected to power the internal circuits of the data transfer circuit 100 at a particular level. Thus, the components (e.g., transistors) and circuitry implementing the data transfer circuit 100 are designed under an assumption that a fixed value power supply voltage will be consistently applied. Of course, those skilled in the art understand that there are significant differences between ideal approaches to the generation and application of a power supply voltage and the real-life difficulties of providing a stable power supply voltage. It is understood, for example, that the level of a power supply voltage applied to a data transfer circuit will typically fluctuate up and down in response to transient noise, loading effects, etc. And such minor fluctuation in the level of a power supply voltage was historically well-tolerated, at least in relation to data transfer circuits. Unfortunately, the increasing rate at which data passes through certain data transfer circuits has greatly reduced the tolerance of such circuits to fluctuating power supply voltages.

Consider the example illustrated in FIG. 2, inclusive of FIGS. 2a, 2b, 2c and 2d.

FIG. 2a comparatively illustrates the difference between an ideal power supply voltage stably set at a medium (or nominal) value VpM over a defined time period, and a noisy power supply voltage that varies from the nominal value VpM either upward to VpH or downward VpL as a function of noise at randomly occurring time periods within the defined time period.

FIG. 2b is a model circuit illustrating relationships between the clock signal (CLK), the applied power supply voltage (Vp), and a resulting jittered clock signal (Jittered CLK) that arise in conventional implementations of the data transfer circuit 100 previously described in relation to FIG. 1. FIGS. 2c and 2d are respective waveform timing diagrams further illustrating a case wherein the noisy power supply voltage of FIG. 2a is applied to the data transfer circuit 100 of FIG. 1. As may be understood from these related diagrams, a clock signal (CLK) is applied to the data transfer circuit 100 of FIG. 2a along with a data input signal (Din) and the power supply voltage (Vp). Ideally, the power supply voltage (Vp) would be fixed at the nominal level (i.e., would be unvaryingly stable at the level of VpM) over the multiple clock cycles shown in FIG. 2. Instead, the noisy power supply voltage (Vp) shown in FIG. 2a is a bad case scenario in which considerable fluctuation exists in the level of the power supply voltage (Vp) as it is applied to the data transfer circuit 100. In this regard, noise may be coupled onto the signal line(s) providing the power supply voltage (Vp) to the data transfer circuit 100. Under the influence of this "Vp noise", the actual level of the power supply voltage (Vp) rises and falls (e.g.) between the VpM and VpL levels.

As conceptually illustrated in FIGS. 2b and 2c, a delayed but otherwise unaltered version of the clock signal (CLK) that should desirably operate within the data transfer circuit 100 to gate the input data (Din) through the data transfer circuit 100 as output data (Dout). However, certain components (e.g., transistors) within the circuitry implementing the data transfer circuit 100 respond to the noisy power supply voltage by running relatively faster during periods of elevated power supply voltage, and slower during periods of reduced power supply voltage. This relationship is illustrated in some additional detail in FIG. 2c.

Referring to FIG. 2c, an ideal delayed clock signal is illustrated by the second timing signal waveform directly below the clock signal (CLK) waveform. This ideal delayed clock signal is characterized by a nominal delay period (TdM) that corresponds to the nominal level (VpM) of the ideal power supply voltage (Vp). Under ideal operating assumptions, each period of the delayed clock signal would have a uniform duration, but this is rarely, if ever, the case in real life. The third signal waveform shown in FIG. 2c illustrates a case wherein an elevated level (VpH) for the power supply voltage (Vp) results in a faster operation of constituent components within the data transfer circuit 100 and an accelerated transition (TdH verses TdM) in the delayed clock signal. Analogously, the fourth signal waveform shown in FIG. 2c illustrates a case wherein a reduced level (VpL) for the power supply voltage (Vp) results in a slower operation of constituent components within the data transfer circuit 100 and a further delayed transition (TdL verses TdM) in the delayed clock signal. The respective acceleration and further delay of the delayed clock signal transitions results in the development and effective application of a "jittered" clock signal within the data transfer circuit 100.

Referring now to FIG. 2d, when the level of the power supply voltage (Vp) is reduced during periods (3), (5), (8), and (10), and when the level of the power supply voltage (Vp) is elevated during (e.g.) periods (2), (4), (7), and (12), false clock edges (i.e., erroneous or transient clock signal transitions) are generated. The presence of these false clock edges (including e.g., the accelerated (+TdH) or further delayed (+tdL) clock signal transitions) caused by variations in the level of the applied power supply voltage (Vp) effectively yield the Jittered clock signal shown in FIG. 2d.

The disastrous effect of the Jittered clock signal on the transfer of the input data (Din) through the data transfer circuit 100 is also illustrated in FIG. 2d. Ideally, the output data (Dout) would be a slightly and consistently delayed (+TdM) version of the "0", "1", "0", "1" . . . bit sequence defined by the input data (Din). However, the false clock edges and uneven clock periods provided by the Jittered clock signal result in multiple erroneous input data (Din) gating operations and the provision of data content-erroneous output data (Dout).

FIG. 3 conceptually illustrates how the regularly applied input clock signal (CLK) in its operative application within the data transfer circuit 100 is converted into a "jittered" clock signal (Jittered CLK) by the presence of the Vp noise. And because the provision of the output data signal (Dout) from the data transfer circuit 100 is synchronous with the clock signal actually applied to the constituent circuits (i.e., the jittered clock signal), the output data (Dout) is altered in its information content relative to the input data signal (Din).

In final result, the timing windows during which each bit of input data (Din) must be coherently transferred from the data transfer 100 circuit as corresponding output data (Dout) shrink as the transfer rate for data passing through the data transfer circuit 100 rises. Such shrinking data transfer windows are less tolerant of the transient or false edges in a clock signal controlling the synchronous output of data from a data transfer circuit. Accordingly, data transfer circuits finding application in high speed integrated circuits are unacceptably susceptible to output data errors caused by noisy or variable power supply voltage(s). And as contemporary integrated circuits are increasingly dense in their integration, the risk of power supply voltage noise (e.g., package inductance noise, printed circuit board noise source coupling, on-chip IR drop, signal line-to-power line cross coupling, etc.) increases.

The difference in information content between the output data (Dout) and input data (Din) of FIG. 2 is exemplary of a worst case scenario in which power supply voltage noise causes significant loss in data coherency.

SUMMARY

One embodiment of the inventive concept provides an integrated circuit device, comprising; a noise detector circuit configured to receive a power supply voltage, detect a power supply voltage noise component from the power supply voltage, and provide a clock delay control signal in response to detected power supply voltage noise component, a clock delay circuit configured to receive a clock signal and delay the clock signal in response to the clock delay control signal to generate a delayed clock signal, and a data transfer circuit configured to receive input data and provide output data corresponding to the input data, wherein the data transfer circuit is powered by the power supply voltage and provides the output data synchronously with the delayed clock signal.

Another embodiment provides a computational system comprising; a processor connected via a system bus to a memory, wherein at least one of the processor and memory comprises a data input/output (I/O) interface connected to a data channel in the system bus. The I/O interface comprises; a noise detector circuit configured to receive a power supply voltage, detect a power supply voltage noise component from the power supply voltage, and provide a clock delay control signal in response to detected power supply voltage noise component, a clock delay circuit configured to receive a clock signal, and delay the clock signal in response to the clock delay control signal to generate a delayed clock signal, and a data transfer circuit configured to receive input data and provide output data corresponding to the input data, wherein the data transfer circuit is powered by the power supply voltage and provides the output data synchronously with the delayed clock signal.

Yet another embodiment provides a method of operating a data transfer circuit, comprising; receiving a power supply voltage powering the data transfer circuit and detecting a power supply voltage noise component from the power supply voltage, generating a clock delay control signal in response to detected power supply voltage noise component, receiving a clock signal and delaying the clock signal in response to the clock delay control signal to generate a delayed clock signal, and receiving input data in the data transfer circuit and providing output data corresponding to the input data synchronously with the delayed clock signal.

Yet another embodiment provides a memory device, comprising; a memory cell array of memory cells configured to store write data and provide read data, a noise detector circuit configured to receive a power supply voltage, detect a power supply voltage noise component from the power supply voltage, and provide a clock delay control signal in response to the detected power supply voltage noise component, a clock delay circuit configured to receive a clock signal and delay the clock signal in response to the clock delay control signal to generate a delayed clock signal, and a data transfer circuit configured to receive the read data from the memory cell array and provide output data corresponding to the read data, wherein the data transfer circuit is powered by the power supply voltage and provides the output data synchronously with the delayed clock signal.

BRIEF DESCRIPTION OF THE DRAWINGS

FIG. 2 collectively includes FIGS. 2a, 2b, 2c, and 2d, where

FIG. 4 collectively includes FIGS. 4a and 4b, wherein

FIG. 5 collectively includes FIGS. 5a, 5b, 5c, and 5d, where

FIG. 13 collectively includes FIGS. 13a, 13b and 13c, wherein

FIG. 14 collectively includes FIGS. 14a and 14b, wherein

DESCRIPTION OF EMBODIMENTS

Reference will now be made to certain embodiments of the inventive concept illustrated in the accompanying drawings. Throughout the drawings and written description, like reference numbers and labels are used to indicate like or similar elements, signals and features.

It should be noted that the present inventive concept may be embodied in many different forms. Accordingly, the inventive concept should not be construed as limited to only the illustrated embodiments. Rather, these embodiments are presented as teaching examples.

Those skilled in the art will recognize that enumerating terms (e.g., first, second, etc.) are used merely to distinguish between various elements. These terms do not define some numerical limitation on such elements.

As used herein, the term "and/or" includes any and all combinations of one or more of the associated listed elements. It is further understood that when an element is said to be "connected" or "coupled" to another element, it may be directly connected or coupled to the other element, or intervening elements may be present. In contrast, when an element is referred to as being "directly connected" or "directly coupled" to another element, no material intervening elements will be present. Other words used to describe element relationships should be interpreted in a like fashion (e.g., "between" versus "directly between," "adjacent" versus "directly adjacent," etc.).

Unless otherwise defined, all terms (including technical and scientific terms) used herein have the same meaning as commonly understood by one of ordinary skill in the art. It is further understood that terms, such as those defined in commonly used dictionaries, should be interpreted as having a meaning that is consistent with their meaning in the context of the relevant art and will not be interpreted in an idealized or overly formal sense unless expressly so defined herein.

Recognizing that demands for increased operating speed will continue to be placed on emerging integrated circuit devices, a data transfer circuit is required which exhibits better immunity to power supply voltage noise. That is, recognizing the impracticality of attempting to eliminate all possible noise events adversely affecting a power supply voltage, yet also recognizing the unacceptability of data output errors being routinely introduced by data transfer circuits running at high speed, an improved approach to operating data transfer circuits within integrated circuit devices is required.

Figure 4A:
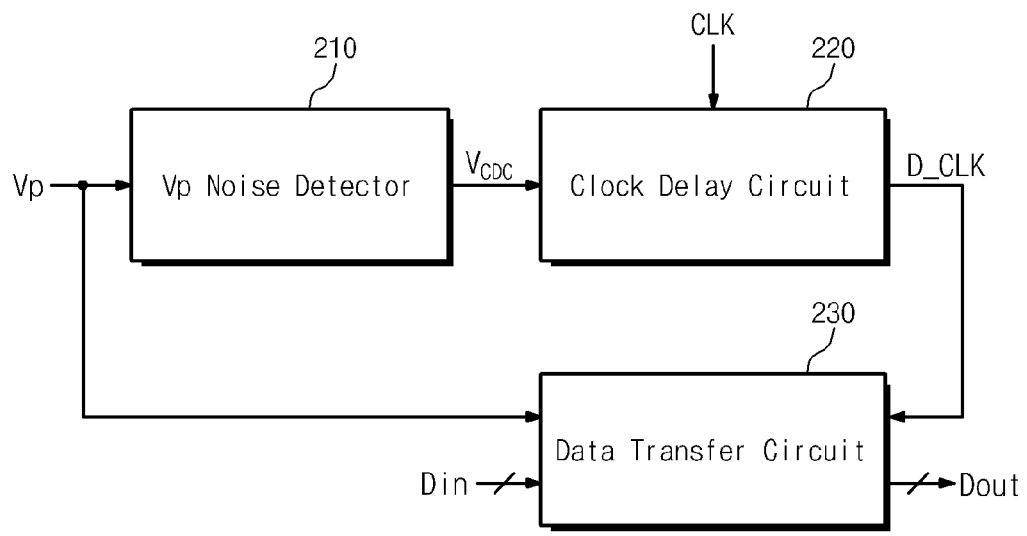
FIG. 4a is a block diagram of an input/output (I/O) interface for an integrated circuit incorporating a data transfer circuit controlled in its operation according to an embodiment of the inventive concept.

FIG. 4a is a block level diagram illustrating a data transfer circuit and method according to certain embodiments of the inventive concept. The data transfer circuit and method of the inventive concept exhibit dramatically improved immunity to noisy power supply voltages, as compared with conventional data transfer circuits and methods.

It should be noted that data transfer circuit 230 of FIG. 4a may be variously implemented using internal circuitry similar to many conventional data transfer circuits. It has already been noted that there are many different types of data transfer circuits adapted for use within different types of integrated circuit devices (e.g., semiconductor memory devices, controllers, data switches, receivers, transmitters, etc.). Embodiments of the inventive concept may be applied to any or all conventionally understood data transfer circuits and methods.

Figure 1:
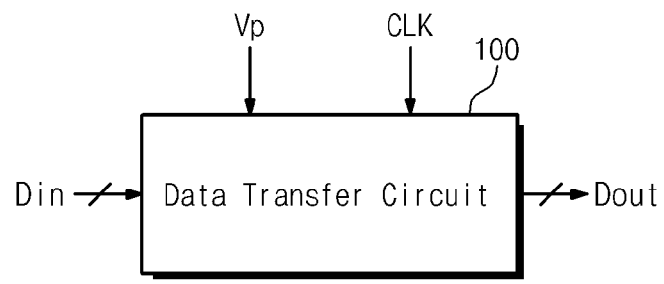
FIG. 1 is a block diagram of a conventional data transfer circuit.

Comparing the conventional data transfer circuit of FIG. 1 with the embodiment of the inventive concept of FIG. 4a, one notes that at least one of the applied control signals (i.e., the applied clock signal) has been altered. In FIG. 4a, the data transfer circuit 230 receives a power supply voltage (Vp) and an input data signal (Din). Similar to the conventional example previously described, the data transfer circuit 230 provides an output data signal (Dout) having information content corresponding to the input data signal (Din) synchronously with an applied clock signal. However, it is in the definition (or conditioning) of the applied clock signal that the illustrated embodiment of the inventive concept differs from the conventional example.

Namely, the power supply voltage (Vp) in addition to being applied directly to the data transfer circuit 230 is applied to a power supply voltage noise detector 210. The power supply voltage detector 210 may be variously configured using conventionally understood circuitry to detect a power supply voltage noise component (Vp Noise) of the power supply voltage signal (Vp). The detected power supply voltage noise component (Vp Noise) may be variation in the level of the power supply voltage (Vp) from a nominal level. This type of power supply voltage noise component will be generally referred to hereafter as "amplitude jitter". Alternately or additionally, the detected power supply voltage noise component (Vp Noise) may be a variation in the frequency of the power supply voltage from a nominal frequency. This type of power supply voltage noise component will be generally referred to hereafter as "frequency jitter". For example, one or more high frequency noise components coupled onto a nominally DC power supply voltage may be detected by the power supply voltage detector 210 as frequency jitter.

In the illustrated example of FIG. 4a, the power supply voltage noise component (Vp Noise) detected by the power supply voltage detector 210 is used to generate a clock delay control signal ($V_{CDC}$) applied to a clock delay circuit 220. The clock delay circuit 220 also receives an input clock signal (CLK) and generally provides a delayed version of the clock signal (hereafter, "the delayed clock signal" or D_CLK). The input clock signal (CLK) may be the same clock signal applied to conventional data transfer circuits, such as the one described in relation to FIG. 1. The amount of delay applied to the input clock signal (CLK) by the clock delay circuit 220 is a function of the clock delay control signal ($V_{CDC}$).

Figure 4B:
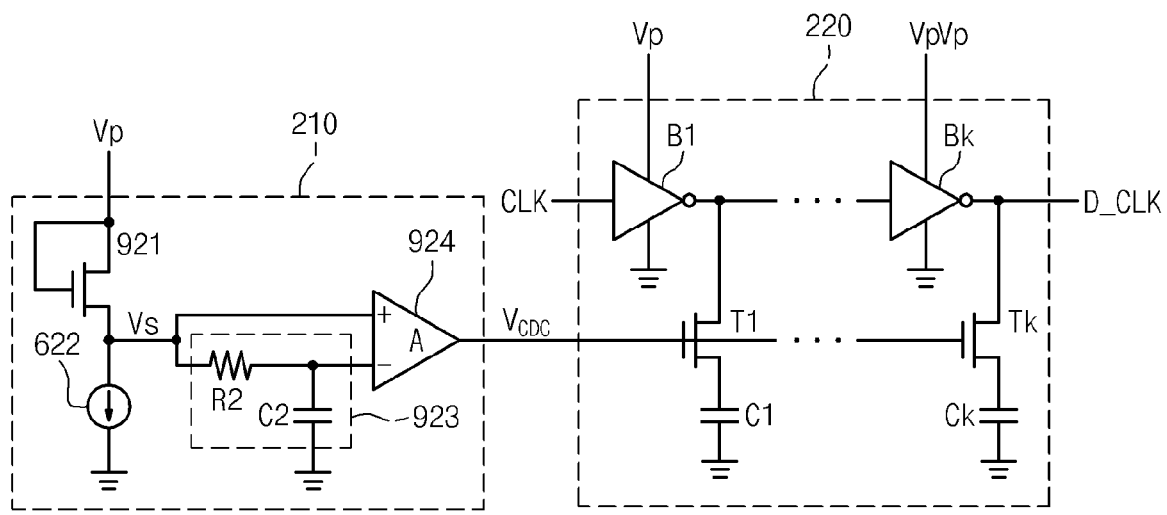
FIG. 4b is a circuit diagram further illustrating the power supply noise detector and clock delay circuit of FIG. 4a according to an embodiment of the inventive concept.

As noted above, those skilled in the art will understand that many different types of conventionally understood amplitude (and frequency) noise detectors and clock delay circuits may be used within embodiments of the inventive concept. One possible and more particular arrangement of a power supply voltage amplitude noise detector 210 and a corresponding clock delay circuit 220 are illustrated in FIG. 4b. The power supply voltage amplitude noise detector 210 receives the power supply voltage (Vp) and connects it to ground across a series connection of a transistor 921 connected as a source follower and a constant current source 922. Thus, a source voltage ($V_S$) provided by the transistor 921 has a level equal to the power supply voltage (Vp) minus the threshold voltage ($V_{TH}$) of the transistor 921, or ($V_S$=Vp-$V_{TH}$). The source voltage ($V_S$) is directly applied to the positive (+) input terminal of a differential amplifier 924, and also applied to the negative (−) input terminal of the differential amplifier 924 through a low pass (RC) filter 923 formed by a conventional arrangement of a capacitor C2 and resistor R2. Accordingly, only a low frequency portion of the source voltage ($V_S$) is applied to the negative (−) input terminal of the differential amplifier 924. A voltage difference between the source voltage ($V_S$) and the low frequency portion of the source voltage ($V_S$) is amplified and output by the differential amplifier 924 as the clock delay control signal ($V_{CDC}$).

The clock delay control signal ($V_{CDC}$) is then applied to the respective gates of a plurality of "k" transistors (T1-Tk) in the voltage control delay line (VCDL) forming the clock delay circuit 220. Each transistor in VCDL of the clock delay circuit 220 is connected between a corresponding capacitor (C1-Ck) and the output of a respective inverter (B1-Bk). Further, the individual transistors in the plurality of transistors (T1-Tk) are differently sized, such that each one is turned ON by a different (i.e., an increasing) gate voltage level. The plurality of inverters (B1-Bk) is series connected between an input terminal receiving the input clock signal (CLK) and an output terminal providing the delayed clock signal (D_CLK). And each one of the plurality of capacitors (C1-Ck) is connected to ground.

With this configuration, each one of the plurality of transistors (T1-Tk) having a threshold voltage less than or equal to a current level of the voltage control signal (VCTL) is turned ON. Each turned-ON transistor (T1-Tk) respectively connects a corresponding one the plurality of capacitors (C1-Ck) with one of the plurality of inverters (B1-Bk). The delay imparted to the signal line communicating the input clock signal (CLK) is a function of how many connected capacitors load the clock signal line. Thus, when the clock delay control signal ($V_{CDC}$) is low, few if any capacitors (C1-Ck) will be connected and the resulting delay is small, but as the clock delay control signal ($V_{CDC}$) increases more capacitors (C1-Ck) will be connected and the resulting delay increases.

From the foregoing it can be seen that by setting the differential amplifier 924 to a level equal to Vp, variations above/below Vp will generate a correspondingly higher/lower clock delay control signal ($V_{CDC}$) and a greater/lesser clock signal delay. In this manner, the timing of the delayed clock signal (D_CLK) ultimately applied to the data transfer circuit 230 in FIG. 4a may be effectively adjusted in relation to variations in the amplitude of the power supply voltage (Vp).

Figure 5A:
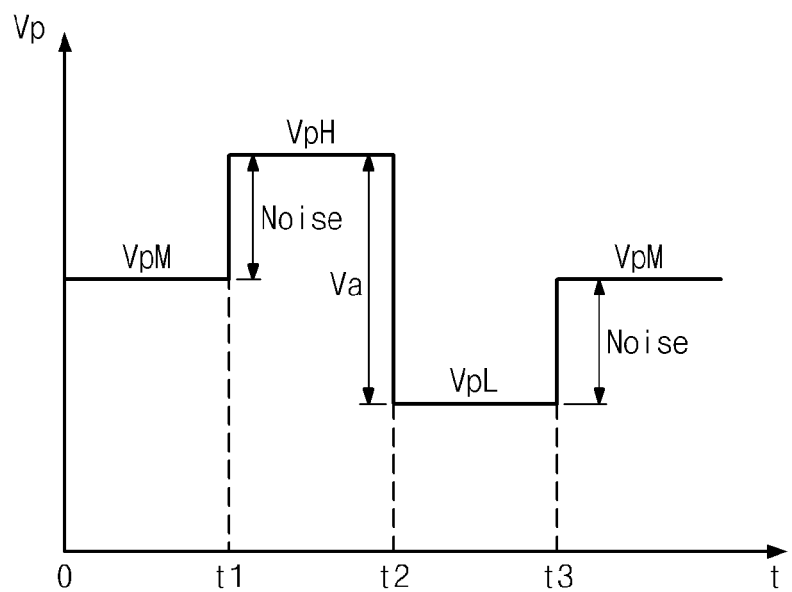
FIG. 5a is a waveform diagram illustrating the difference between an ideal power supply voltage (Vp) and a noisy power supply voltage.
Figure 5A:
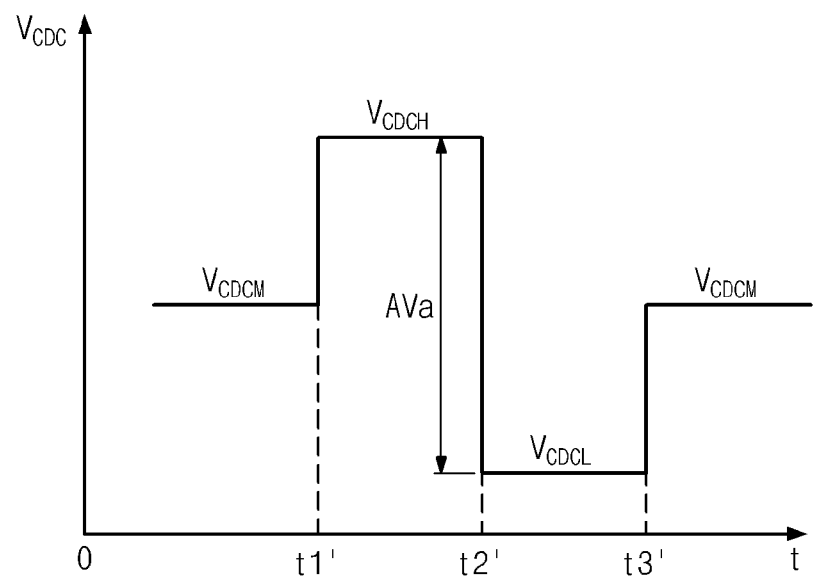
Figure 5B:
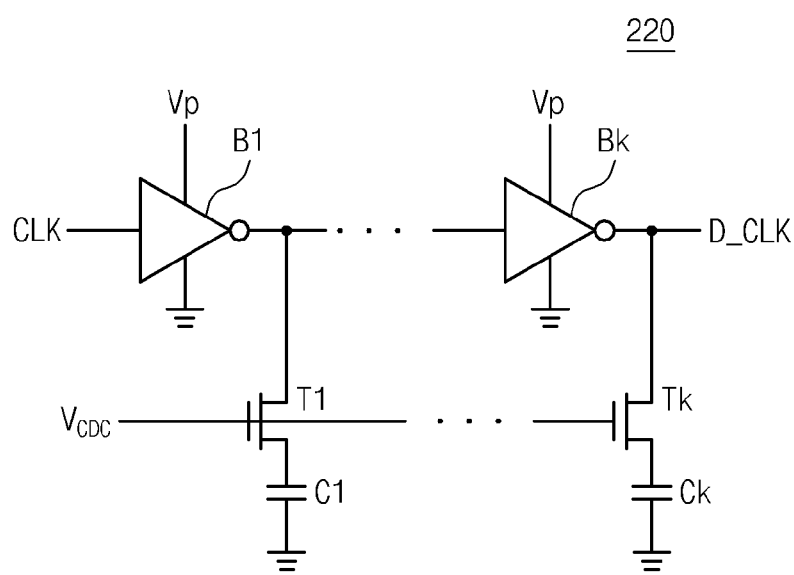
FIG. 5b is a model circuit diagram illustrating the application of the noisy power supply voltage to the data transfer circuit in relation to a jittered delayed clock signal.
Figure 5C:
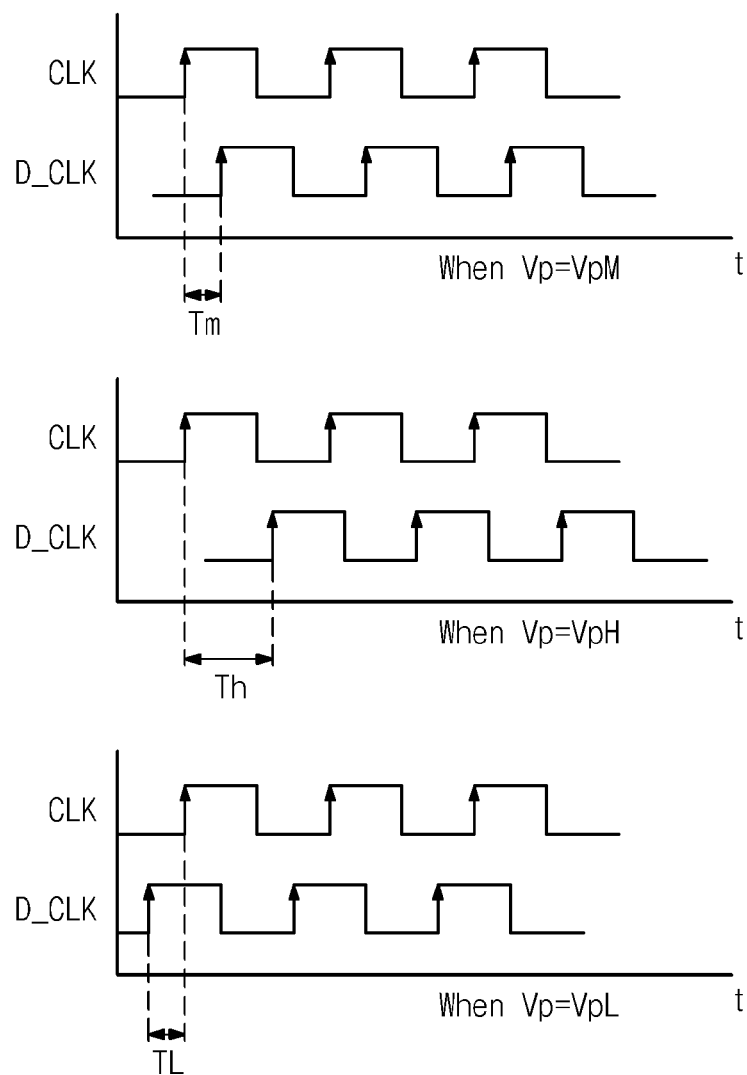
FIGS. 5c and 5d are waveform diagrams further illustrating the operation of the data transfer circuit of FIGS. 4a and 4b in response to a noisy power supply voltage.
Figure 5D:
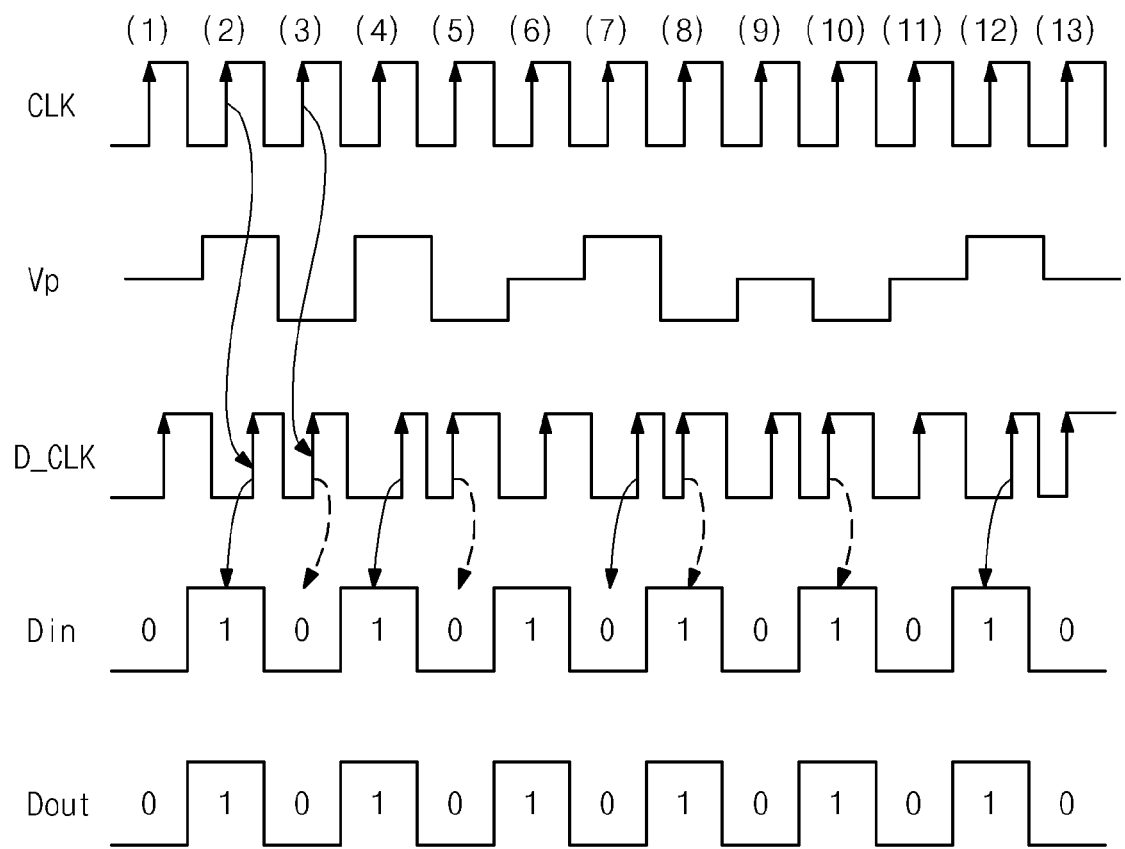
Figure 6:
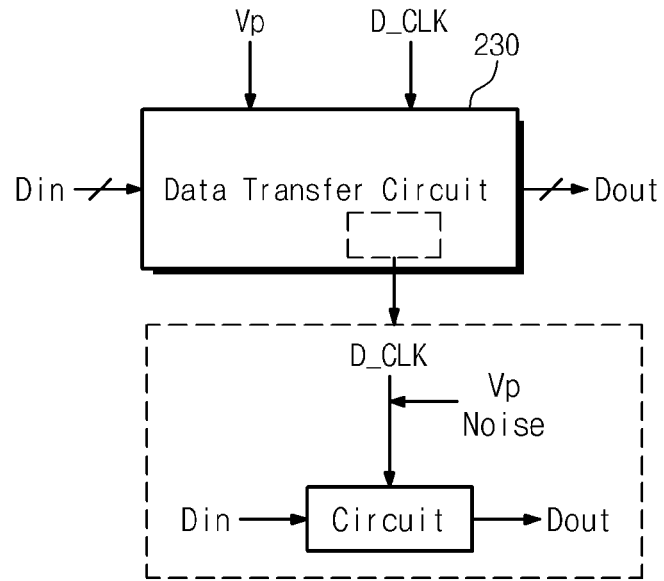
FIG. 6 is a conceptual diagram further illustrating the development of a jittered delayed clock signal controlling the operation of the data transfer circuit of FIGS. 4 and 5.

The embodiments illustrated in FIGS. 4a and 4b will be further described in relation to FIGS. 5 and 6. FIG. 5, inclusive of FIGS. 5a, 5b, 5c and 5d, are related signal waveform and circuit diagrams that further illustrate various relationships set forth in the embodiments of FIGS. 4a and 4b. FIG. 6 is a corresponding block level diagram that further conceptually illustrates the embodiments of FIGS. 4a and 4b.

Figure 2A:
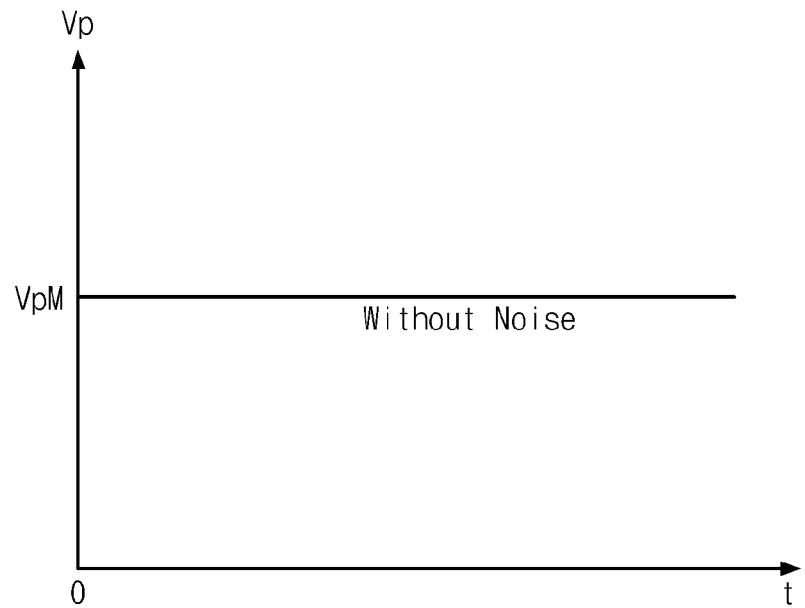
FIG. 2a is a waveform diagram illustrating the difference between an ideal power supply voltage (Vp) and a noisy power supply voltage.
Figure 2A:
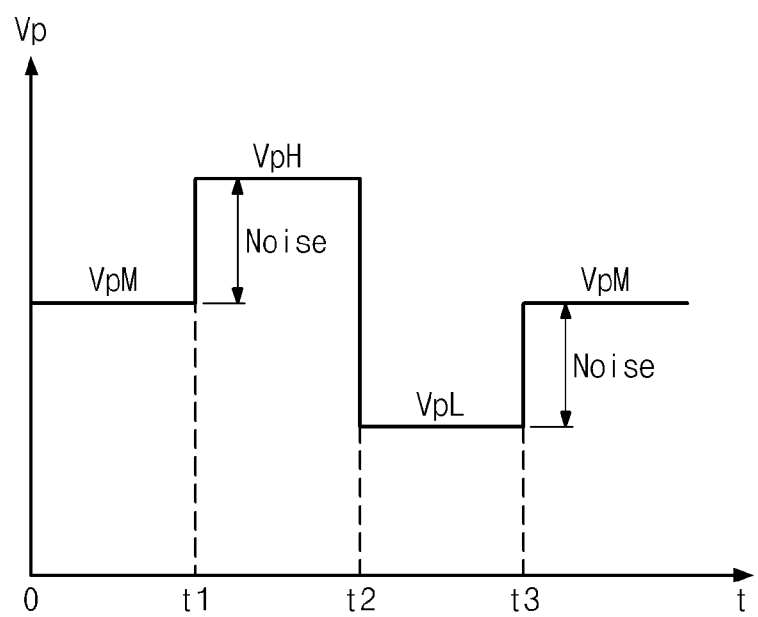

For purposes of further description it is assumed that the power supply voltage detector 210 of FIGS. 4a and 4b detects amplitude jitter associated with the power supply voltage (Vp). Analogous to the conventional example described in relation to FIG. 2a, the power supply voltage (Vp) of FIG. 5a is assumed to significantly vary up (VpH) and down (VpL) from a nominal level (VpM). Thus, a dynamic range (Va) for the power supply voltage (Vp) is assumed in the upper graph example of FIG. 5a.

As described above, however, the dynamic range (Va) for the power supply voltage (Vp) applied within embodiments of the inventive concept results in a variable and compensating clock delay control signal ($V_{CDC}$) being generated, for example, by differential amplifier 924. Thus, in response to the dynamic range (Va) of the power supply voltage (Vp), the combination of the power supply voltage noise detector 210 and the clock delay circuit 220 generates a clock delay control signal (VCDC) having a commensurate control range (aVa), as illustrated in the lower graph of FIG. 5a.

Figure 2B:
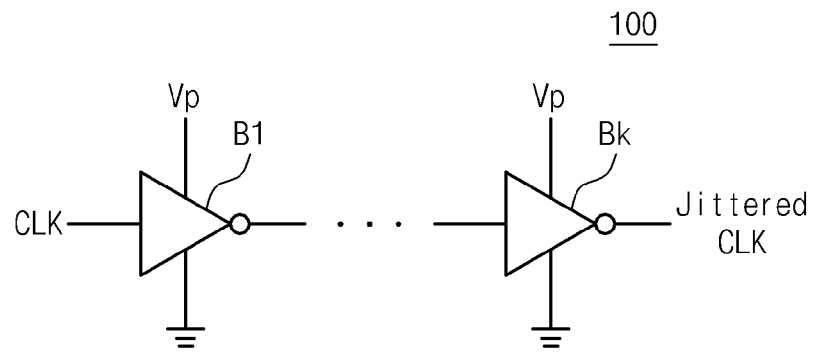
FIG. 2b is a model circuit diagram illustrating the application of the noisy power supply voltage to the data transfer circuit in relation to a jittered clock signal.

Analogous to FIG. 2b, FIG. 5b is a model circuit illustrating relationships between the clock signal (CLK), the applied power supply voltage (Vp), and a resulting delayed clock signal (D_CLK). However, unlike the conventional implementations previously described that yield a Jittered clock signal, the clock delay circuit 220 of FIGS. 4a and 4b further receive the compensating clock delay control signal ($V_{CDC}$) from the power supply noise detector 210.

Due to the compensating presence of the clock delay control signal ($V_{CDC}$), the illustrated embodiments of the inventive concept essentially generate a jittered delayed clock signal, rather than the jittered clock signal (Jittered CLK) conventionally provided. It should be noted that this jittered clock signal is a virtual clock signal generated by the combination of the delayed clock signal and the noise component of the power supply voltage (Vp).

Figure 2C:
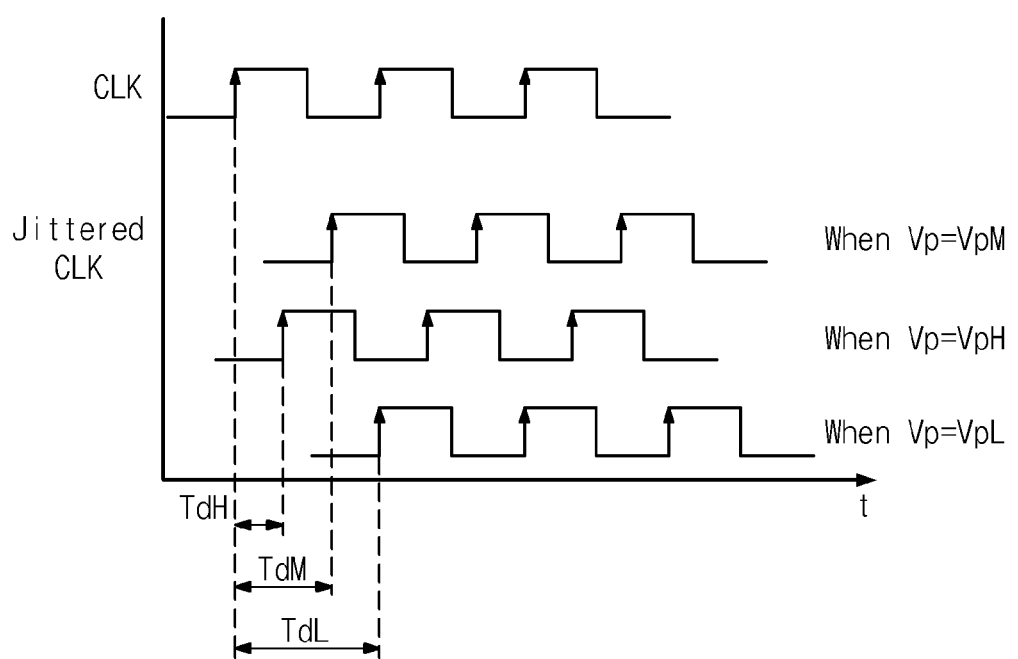
FIGS. 2c and 2d are waveform diagrams further illustrating the operation of the data transfer circuit of FIG. 1 in response to a noisy power supply voltage.

FIG. 5c includes respective waveform timing diagrams further illustrating certain signal timing relationships between the clock signal (CLK) and the delayed clock signal (D_CLK) provided by embodiments of the inventive concept. An informative comparison may by drawn between FIG. 5c and FIG. 2c. The waveform diagrams of FIG. 5c again correspond to the three (3) possible cases for the power supply voltage (Vp) assumed in FIG. 2c. The upper graph of FIG. 5c illustrates an ideal case for the power supply voltage (VpM), the middle graph of FIG. 5c illustrates a case wherein the power supply voltage is high (VpH), and the lower graph of FIG. 5c illustrates a case wherein the power supply voltage is low (VpL). Of particular note, each of the illustrated cases results in a different delayed version of the delayed clock signal (D_CLK). However, the different levels of the power supply voltage (Vp) also result in different, compensating, clock delay control signals ($V_{CDC}$) that effectively generate the delayed clock signal (D_CLK) as an appropriately jitter-compensated, delayed clock signal. In its subsequent application, the appropriately jitter-compensated delayed clock signal (D_CLK) is characterized by stable periods defined in relation to a nominal delay (TdM) which is maintained despite clock edge variations that would conventionally arise due to the effects of variable period delays (e.g., Th1, Th2) when the power supply voltage is at the elevated level (VpH) and reduced level (VpL).

Figure 2D:
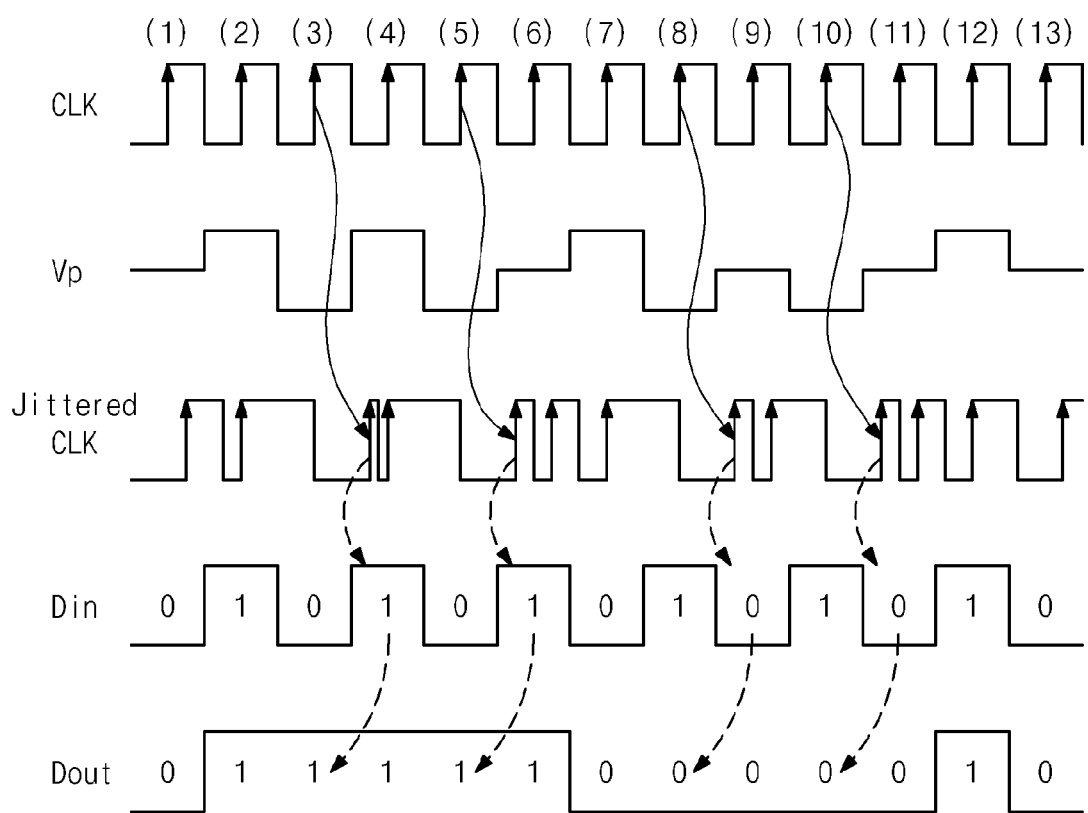

Referring to FIG. 5d and comparing the results show in FIG. 5d with those shown in FIG. 2d, it may be clearly understand that the effective application of the jitter-compensated delayed clock signal (D_CLK) to data transfer circuits contemplated by embodiments of the inventive concept has profound benefits. That is, despite assuming the same worse case power supply voltage (Vp) previously assumed for the example of FIG. 2d, the foregoing embodiments nonetheless provide a stable gating clock signal (Jittered D_CLK) to control the transfer of the input data (Din) as output data (Dout).

In the conventional example previously described, the level of amplitude jitter in the applied power supply voltage (Vp) resulted in a loss of output data (Dout) coherency relative to the input data (Din). But this is not the case for embodiments of the inventive concept, such as those illustrated in FIGS. 4a and 4b.

During periods wherein the level of the power supply voltage (Vp) is elevated above (VpH) the nominal level (VpM), as is indicated by the level of the clock delay control signal ($V_{CDC}$) applied to the clock delay circuit 220 (see, FIG. 5a), the clock delay circuit 220 will generate and apply a relatively long delay to the input clock signal (CLK). During periods wherein the level of the power supply voltage (Vp) is reduced below (VpL) the nominal level (VpM), as is also indicated by the clock delay control signal ($V_{CDC}$) applied to the clock delay circuit 220 (see again, FIG. 5a), the clock delay circuit 220 will generate and apply a relatively short delay to the input clock signal (CLK). The shorter or longer delays applied to portions of the input clock signal (CLK) by the clock delay circuit 220 may be defined to compensate for any slower or faster running components (e.g., transistors) within the data transfer circuit 230 relative to elevated (VpH) or reduced (VpL) levels of the power supply voltage (Vp). In this context, the phrase "slower or faster running" has relative reference to a nominal operating speed (TdM) for components in the data transfer circuit 230 when the nominal power supply voltage (VpM) is applied. The necessary compensating delays to-be-applied to the input clock signal (CLK) may be empirically determined, or derived by mathematical modeling for an expected range of the power supply voltage (Vp).

Thus, as illustrated in FIG. 5, the frequency of the input clock signal (CLK) may be adjusted (e.g., on a period by period basis) in response to the clock delay control signal ($V_{CDC}$) in order to generate a compensating (or preconditioned) delayed clock signal (D_CLK). The resulting delayed clock signal (D_CLK) may then be applied to the data transfer circuit 230 as a controlling clock signal to control the transfer of input data (Din) through the data transfer circuit 230 in order to provide the output data (Dout).

Figure 3:
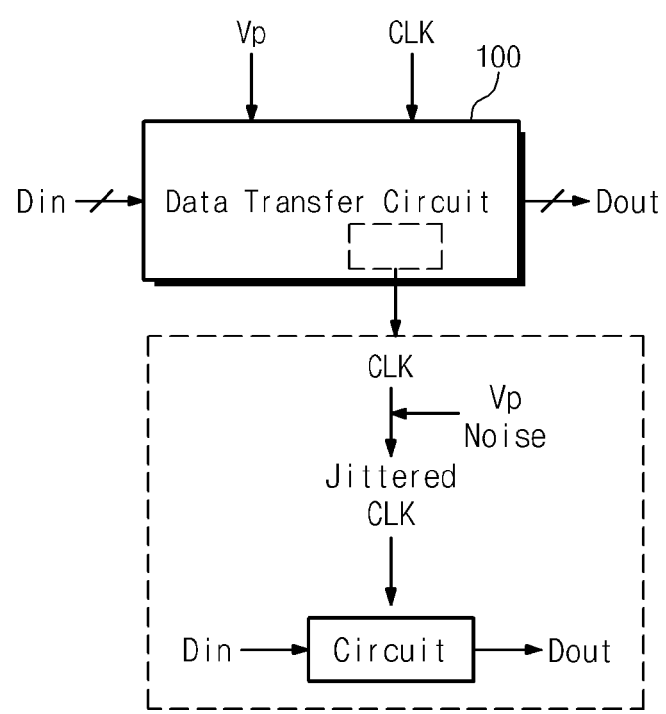
FIG. 3 is a conceptual diagram further illustrating the development of a jittered clock signal controlling the operation of the data transfer circuit of FIGS. 1 and 2.

However, as explained in relation to the conventional example of FIGS. 1 and 2, it is understood that any clock signal applied to the data transfer circuit to control the transfer of data through the data transfer circuit will be altered by noise associated with the power supply voltage (Vp). Hence, FIGS. 5 and 6 collectively illustrate the generation of a jitter-compensated delayed clock signal (D_CLK), instead of the previously described jittered clock signal (Jittered CLK). It is this preconditioned clock signal—which has been modified to compensate for noise associated with the power supply voltage Vp—that actually controls the transfer of data through the data transfer circuit 230. Because the delayed clock signal (D_CLK) is a version of the input clock signal (CLK) that has been preconditioned (or compensated) in anticipation of the effects of the power supply voltage noise component (Vp Noise) on the data transfer circuit 230, the resulting jitter-compensated delayed clock signal (D_CLK) may be viewed in its effect as a reconstituted version of the original input clock signal (CLK), albeit a version delayed in time. As suggested by the respective waveform diagrams of FIG. 5, this reconstituted version of the input clock signal (CLK) may be shifted in phase relative to the input clock signal (CLK), but it will not include the erroneous or transient clock transitions or the clock signal variation that characterizes the conventionally applied jitter clock signal (Jittered CLK). As may be seen from a comparison of FIG. 2 with FIG. 5, and FIG. 3 with FIG. 6, the application of a preconditioned clock signal (i.e., the delayed clock signal D_CLK) to the data transfer circuit 230 prevents the loss of coherency between the output data (Dout) and input data (Din).

Figure 7:
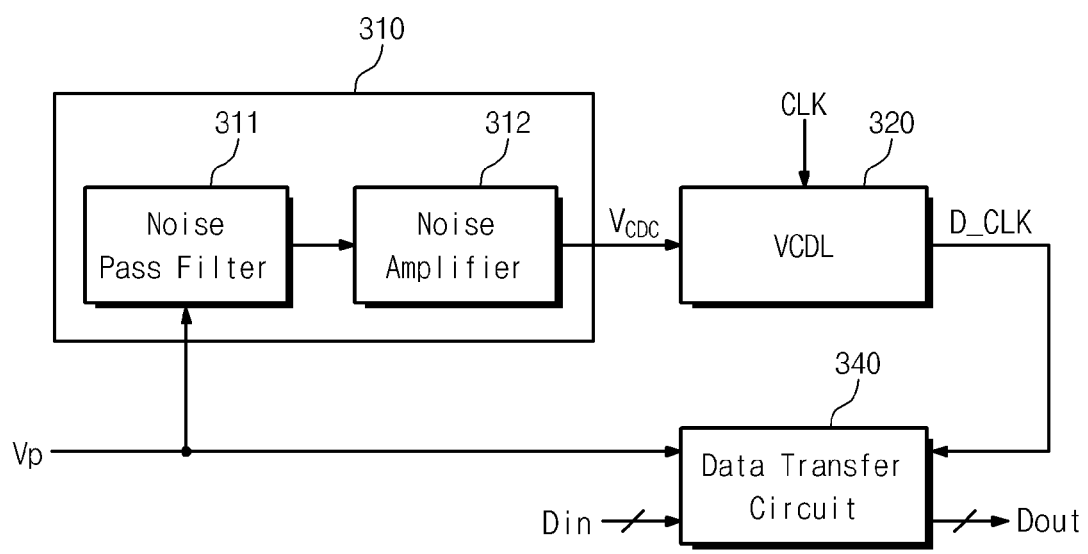
FIG. 7 is a block diagram of an input/output (I/O) interface for an integrated circuit incorporating a data transfer circuit controlled in its operation according to another embodiment of the inventive concept.

FIG. 7 illustrates another embodiment of the inventive concept in some additional detail relative to the embodiments of FIGS. 4a and 4b. Data transfer circuit 340 of FIG. 7 is directly analogous to the data transfer circuit 230 of FIG. 4a. It receives the input data (Din), the power supply voltage (Vp) and the delayed clock signal (D_CLK), and provides the output data (Dout) to (e.g.) a data output pad (DQ Pad) associated with an I/O interface of an integrated circuit device. The embodiment illustrated in FIG. 7, however, teaches the specific use of a voltage controlled delay line (VCDL) 320 as one possible implementation of a clock delay circuit receiving the input clock signal (CLK) and clock delay control signal ($V_{CDC}$), and providing the delayed clock signal (D_CLK). Those skilled in the art will recognize that many different and conventionally understood voltage controlled delay line (VCDL) circuits may be used in this context.

The embodiment of the inventive concept illustrated in FIG. 7 further teaches the possible combination use of a noise pass filter 311 and a noise amplifier 312 to implement a power supply voltage noise detector 310. Using this particular approach, amplitude jitter and/or frequency jitter may be detected from the power supply voltage (Vp) applied to the power supply voltage noise detector 310. For example, the noise pass filter 311 may detect amplitude variations from a defined nominal level (e.g., $V_{DD}$) or frequency variations from a defined nominal frequency and provide a corresponding "filtered noise response". The filtered noise response (i.e., the detected amplitude jitter and/or frequency jitter) may then be appropriately amplified by the noise amplifier 312 to generate the clock delay control signal ($V_{CDC}$) applied to the clock delay circuit (e.g., VCDL) 320. Here again, those skilled in the art will recognize that many different conventionally understood noise pass filters and noise amplifiers may be used in the context of the illustrated embodiment.

Figure 8:
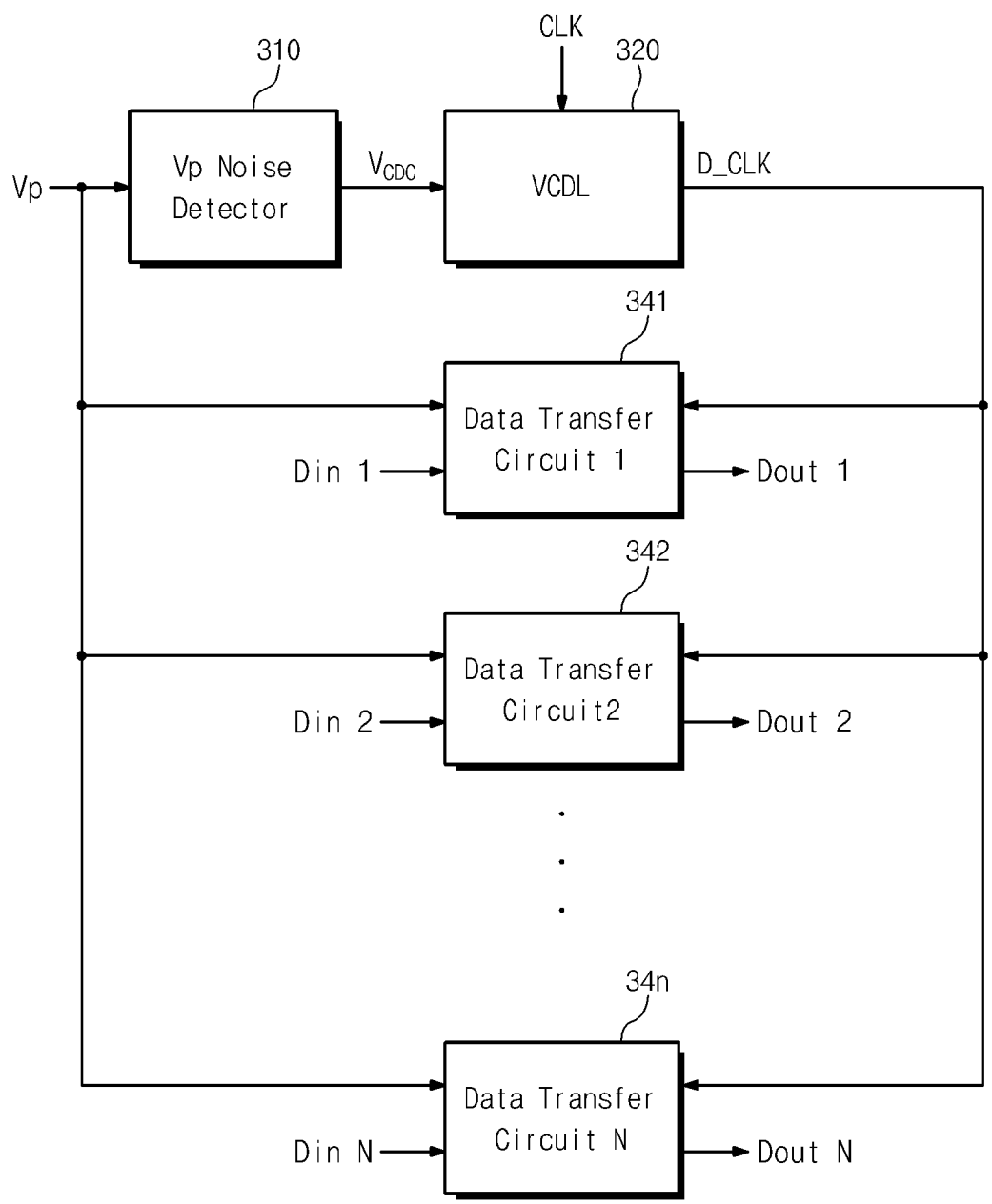
FIG. 8 is a block diagram of an input/output (I/O) interface for an integrated circuit incorporating multiple data transfer circuits controlled in their operation according to an embodiment of the inventive concept.

The embodiment of the inventive concept illustrated in FIG. 8 extends the previous teachings to an integrated circuit device including a plurality of data transfer circuits, each respective associated with (e.g.) a data output port (e.g., a DQ Pad) forming part of an I/O interface for an integrated circuit device. This is a very common arrangement since many contemporary integrated circuit devices simultaneously transfer a plurality data in parallel via a corresponding plurality of data pads, or similar structures, from an I/O interface. For example, many semiconductor memory devices and related controllers exchange data via multiple data channels provided by a data bus. Opposing ends of each data channel may be respectively connected to the semiconductor memory device and controller via a data port associated with a data transfer circuit according to an embodiment of the inventive concept. Thus, the embodiment of FIG. 8 further assumes a one-for-one relationship between each one of the "N" data ports and "N" data transfer circuits. However, this need not be the case and other embodiments of the inventive concept contemplate the use of data transfer circuits capable of transferring data between more than one data channel and associated data pads.

As illustrated in the embodiment of FIG. 8, a single power supply voltage detector 310 and a single clock delay circuit 320 may be used in combination to generate a delayed clock signal (D_CLK) appropriately preconditioned in relation to a power supply noise component (Vp Noise) to yield a proper jittered delayed clock signal (Jittered D_CLK) ultimately used to control the transfer of data via each one of "n" data transfer circuits 341-34n. Thus, a first data transfer circuit 341 (Data Transfer Circuit 1) receives first input data (Din1), the power supply voltage (Vp) and the delayed clock signal (D_CLK). In response to these input control signals, the first data transfer circuit 341 (Data Transfer Circuit 1) provides error-free first output data (Dout 1) to a first data output port synchronously with the delayed clock signal (D_CLK), despite the presence of noise associated with the applied power supply voltage (Vp). The second through "nth" data transfer circuits 342-34n operate in a similar manner. Consistent with this arrangement, each stream of output data (Dout 1-DoutN) provided to a corresponding one of a plurality of data channels respectively connected to one of the plurality of output data ports will not include data errors (i.e., data information variance with a corresponding stream of input data Din1-DinN) caused by amplitude and/or frequency variations in the applied power supply voltage (Vp).

The embodiment of FIG. 8 presupposes the use of a single (i.e., only one) power supply voltage noise detector 310 in combination with a single clock delay circuit 320. However, more than one power supply detector 310 and/or more than one clock delay circuits 320 may be used in other embodiments of the inventive concept.

Figure 9:
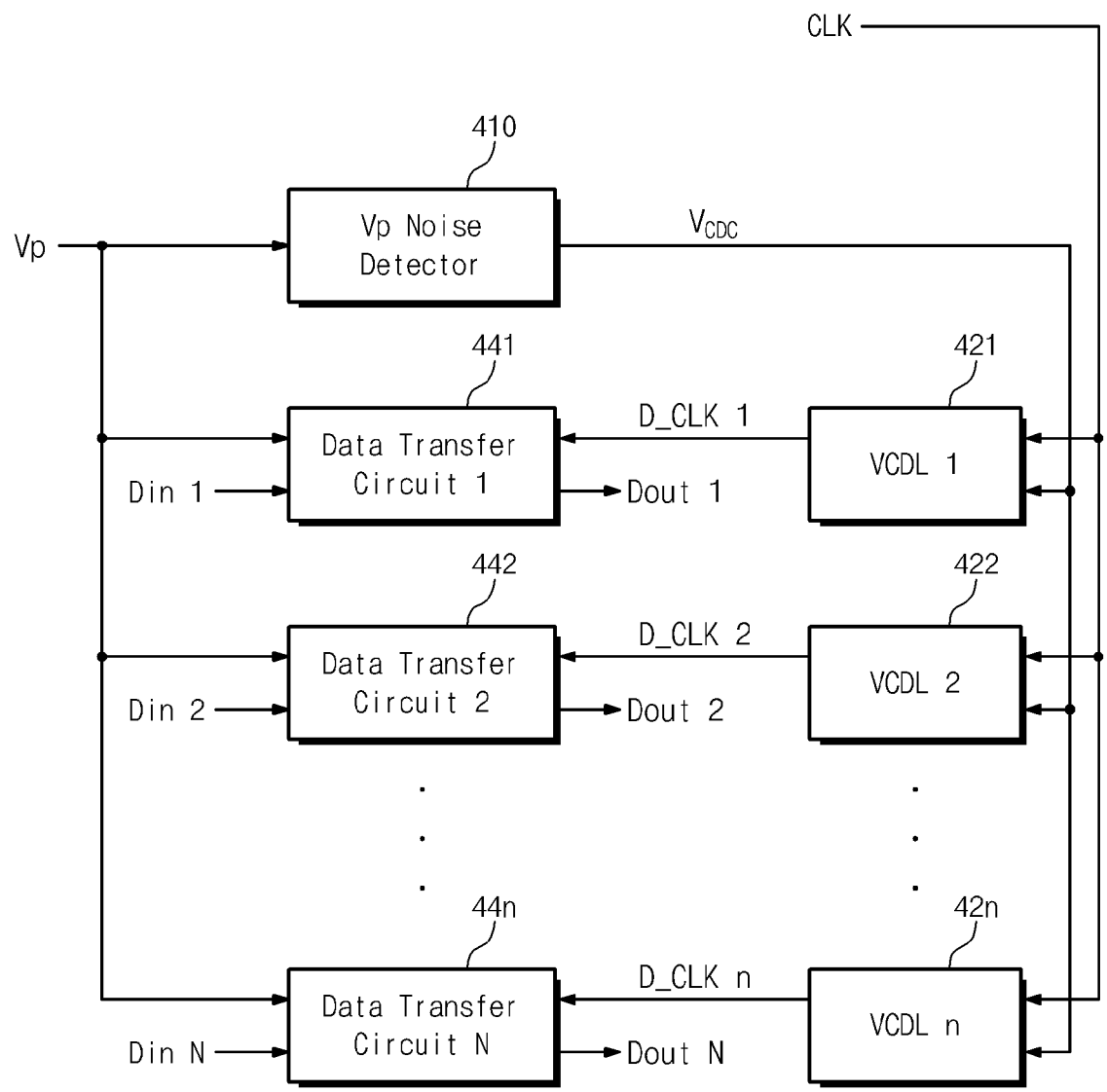
FIG. 9 is a block diagram of an input/output (I/O) interface for an integrated circuit incorporating multiple data transfer circuits controlled in their operation according to an another embodiment of the inventive concept.

For example, the embodiment of FIG. 9 incorporates multiple clock delay circuits 421-42n in the form of respect voltage controlled delay lines (VCDL 1-VCDL n). The use of multiple VCDLs in a one-for-one relationship with a plurality of data transfer circuits 441-44n (Data Transfer Circuit 1-Data Transfer Circuit n) provides certain advantages. For example, one or more of the plurality of data transfer circuits 441-44n may be physically located some considerable distance from other ones of the plurality of data transfer circuits 441-44n, the power supply voltage detector 410, or the power supply voltage source (not shown). In this context, the term "considerable distance" means any length of respective signal line(s) applying the delayed clock signal (D_CLK) or the power supply voltage (Vp), such that signal flight time becomes a relevant factor in the overall operation of the corresponding data transfer circuit. For example, if a first group of data transfer circuits associated with a first group of data output pads were quite remotely located from a second group of data transfer circuits associated with a second group of data output pads, the different flight time(s) for the controlling clock signal applied to each one of the corresponding data transfer circuits 441-44n might become relevant to the generation of an appropriate plurality of delayed clock signals (D_CLK 1-D_CLK n), some of which may differ from others. The provision of a closely proximate and uniquely associated clock delay circuit 421-42n for each one of the plurality of data transfer circuits 441-44n allows each delayed clock signal (D_CLK 1-D_CLK n) to be appropriately defined relative to its physical location with respect to related circuits and signal lines. For example, one embodiment of the inventive concept contemplates the possible application of different delays to the input clock signal (CLK) by different clock delay circuits 421-42n. Assuming similar respective signal line lengths (which may be long) the foregoing capability may be used to further compensate for possible amplitude/frequency variations in the power supply voltage caused by transfer of the power supply voltage via the implicated signal line(s).

Figure 10:
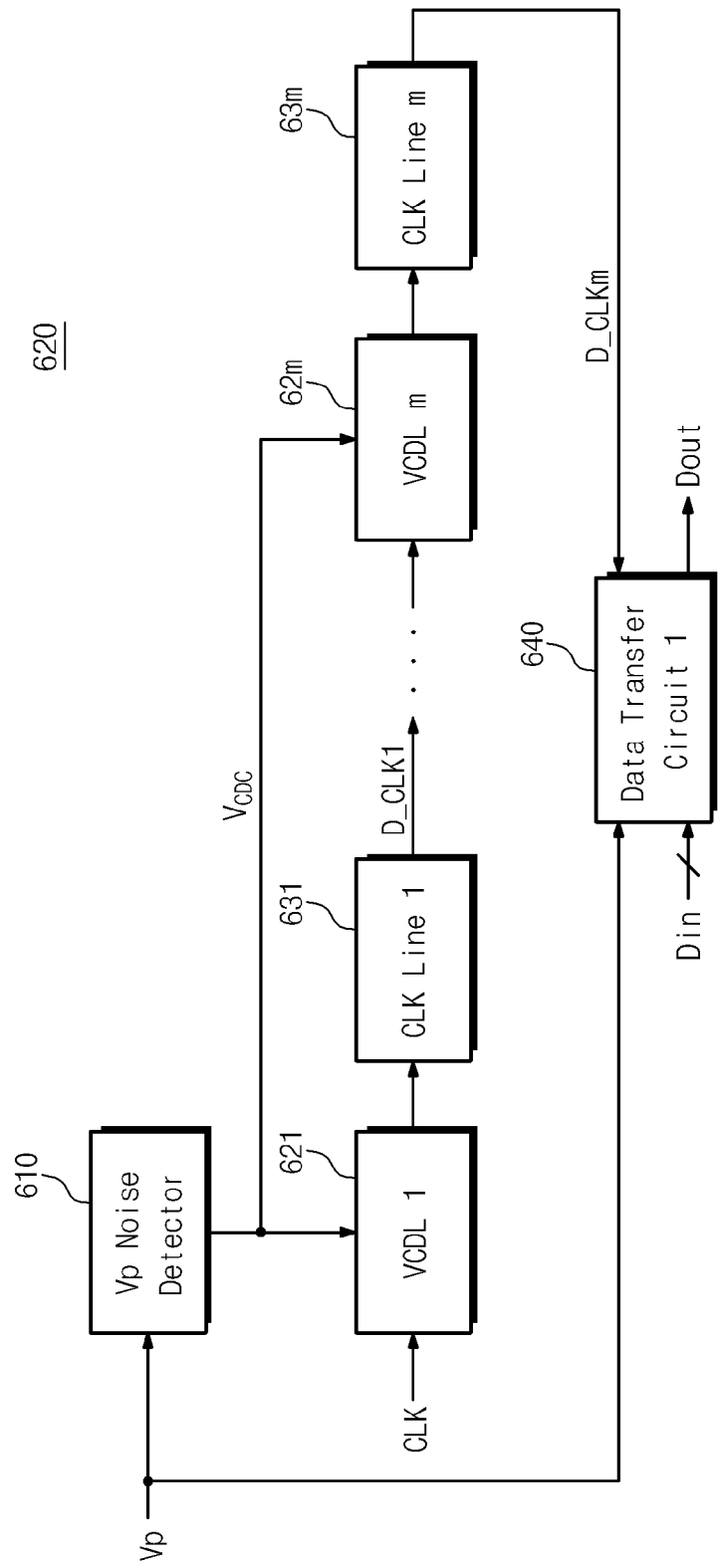
FIG. 10 is a block diagram of an input/output (I/O) interface for an integrated circuit incorporating a data transfer circuit controlled in its operation according to another embodiment of the inventive concept.

The embodiment of FIG. 10 alternately addresses the possibility of long (or variable) signal lines used to communicate the power supply voltage (Vp), the input clock (CLK), and/or the delayed clock signal (D_CLK) to a data transfer circuit. That is, the embodiment illustrated in FIG. 10 provides a ready solution to the problem of generating relatively long delays to-be-applied to the input clock signal (CLK) in order to generate an appropriate delayed clock signal(s) (D_CLK). For example, certain embodiments of the inventive concept may require that fairly extensive delay(s) to-be-applied to the input clock signal (CLK) be quickly and efficiently generated. In such embodiments, a competent clock delay circuit 620 may be implemented using a collection of series connected VCDLs (VCDL 1-VCDL m).

As before, the embodiment of FIG. 10 comprises a power supply voltage noise detector 610 generating the clock delay control signal (VCDC), and a data transfer circuit 640 receiving input data (Din), the power supply voltage (Vp) and a delayed clock signal (D_CLK), and providing output data (Dout) to a corresponding data output pad (DQ Pad).

The embodiment of FIG. 10 also comprises a clock delay circuit 620. The clock delay circuit 620 is implemented as a collection of "m" VCDLs (VCDL 1-VCDL m) connected in series and respectively separated by a corresponding clock line segment (CLK Line 1-CLK Line m). Thus, a first VCDL 1 receives the input clock signal (CLK) and passes it (with a defined first delay) to a second VCDL (not shown) via a first clock line segment CLK Line 1, and so on, until a final "m" VCDL applies a defined final "m" delay. This sequence of series connected VCDLs may be variously tapped using conventionally understood techniques to yield up to "m" different delayed clock signals (D_CLK 1-D_CLK m). In the illustrated embodiment of FIG. 10 the data transfer circuit 640 is shown receiving the final delayed clock signal (D_CLK m) which is generated by the cumulative application of delays through the plurality of "m" VCDLs, as well as the delayed clock signal (D_CLK) flight time through the corresponding "m" clock line segments (CLK Line 1-CLK Line m).

Those skilled in the art will recognize that while the embodiment of FIG. 10 shows only one data transfer circuit 640, a plurality of data transfer circuits (e.g.) like those described in relation to the embodiment of FIGS. 8 and 9 may use one or more of the delayed clock signals (D_CLK 1-D_CLK m) provided by the clock delay circuit 620. Thus, where various signal flight time(s) are less of a design consideration than minimizing the size of a clock delay circuit providing multiple delayed clock signals, the embodiment of FIG. 10 may be preferred over the embodiment of FIG. 9.

Figure 11:
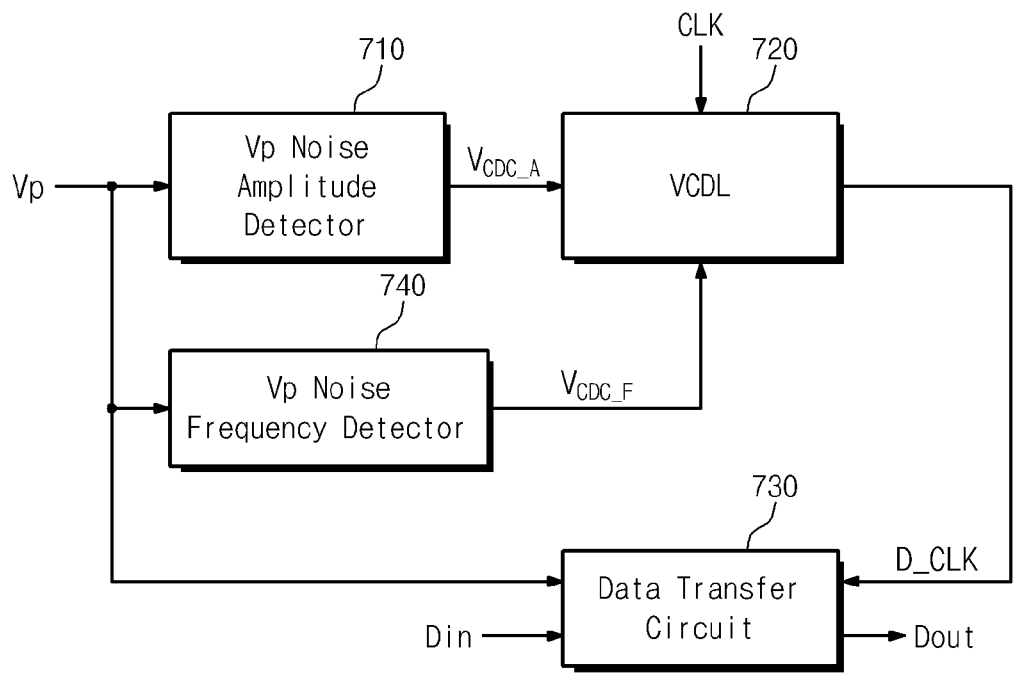
FIG. 11 is a block diagram of an input/output (I/O) interface for an integrated circuit incorporating a data transfer circuit controlled in its operation according to yet another embodiment of the inventive concept.

The embodiment of the inventive concept illustrated in FIG. 11 extends the foregoing teachings to a more specific embodiment capable of detecting both amplitude jitter and frequency jitter, and adjusting the delay applied to the input clock signal (CLK) in view of both of these power supply voltage noise components. That is, the embodiment of FIG. 11 comprises a power supply voltage amplitude noise detector 710 and a power supply voltage frequency noise detector 740, each receiving the power supply voltage (Vp). The clock delay circuit 720 and the data transfer circuit 730 of FIG. 11 are assumed for purposes of this explanation to be directly analogous to the clock delay circuit 220 and the data transfer circuit 230 of FIG. 2. Accordingly, their description will not be repeated.

As previously noted and as will be appreciated by those skilled in the art, both amplitude and frequency noise components related to the power supply voltage (Vp) may adversely effect the transfer of data through a data transfer circuit. Thus, the embodiment of the inventive concept illustrated in FIG. 11 comprises the power supply voltage amplitude noise detector 710 providing an amplitude noise clock delay control signal ($V_{CDC\_A}$) and the power supply voltage frequency noise detector 740 providing a frequency noise clock delay control signal ($V_{CDC\_F}$). Thus, the embodiment of the inventive concept illustrated in FIG. 11 serves as one example in which multiple, relevant noise components detected from a power supply voltage (Vp) powering a data transfer circuit may be taken into account when preconditioning a compensating delayed clock signal (D_CLK) in order to avoid the loss of data coherency between input data (Din) and output data (Dout).

With the foregoing configuration, the embodiment of FIG. 11 not only compensates for amplitude variations in the level of the power supply voltage (Vp), but also compensates for the frequency of noise components associated with the power supply voltage (Vp). For example, relatively high frequency power supply voltage noise will cause the power supply voltage noise frequency detector 740 to generate the frequency noise clock delay control signal ($V_{CDC\_F}$) that reduces the delay applied to the input clock signal (CLK), while relatively low frequency power supply voltage noise will cause the supply voltage noise frequency detector 740 to generate the frequency noise clock delay control signal ($V_{CDC\_F}$) that increases the delay applied to the input clock signal (CLK). In this manner, a range of power supply voltage noise frequencies may be taken into account when preconditioning the input clock signal (CLK) to form an appropriate delayed clock signal (D_CLK) subsequently applied to the data transfer circuit 730.

Figure 12:
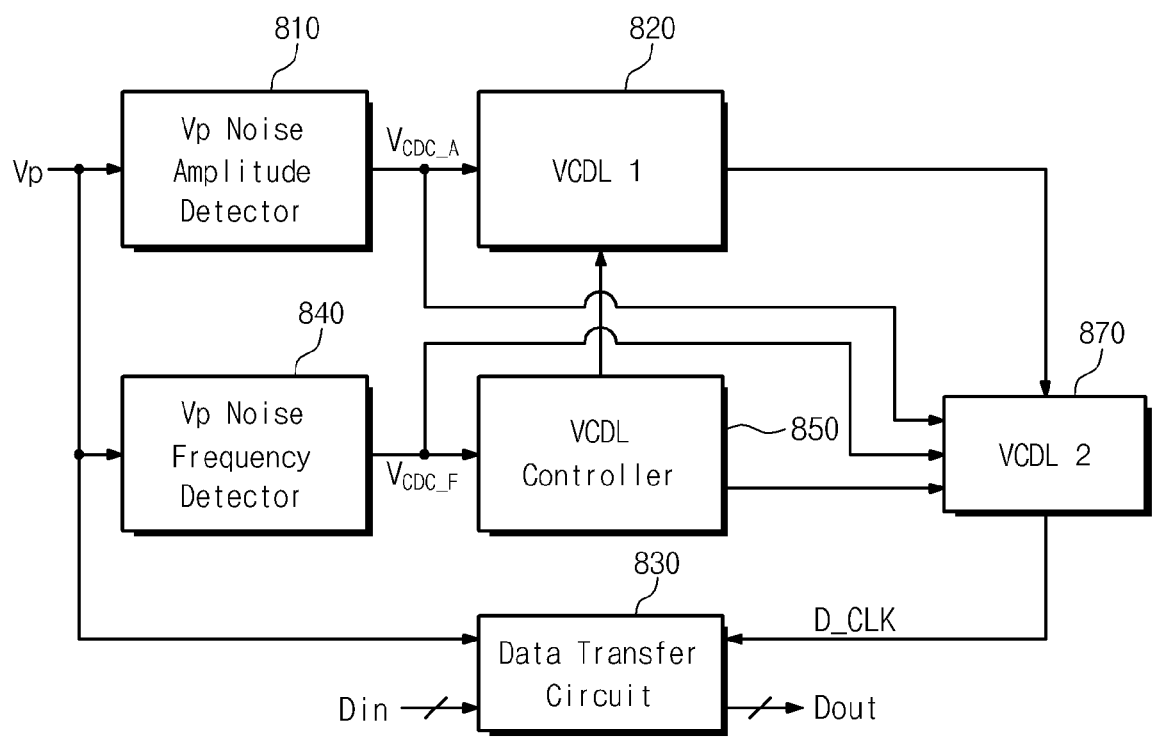
FIG. 12 is a block diagram of an input/output (I/O) interface for an integrated circuit incorporating a data transfer circuit controlled in its operation according to yet another embodiment of the inventive concept.

The circuit diagram of FIG. 12 illustrates yet another embodiment of the inventive concept including both a power supply voltage amplitude noise detector 810 and a power supply voltage frequency noise detector 840, each receiving the power supply voltage (Vp). The illustrated embodiment of FIG. 11 also comprises; a plurality of clock delay circuits (e.g., a first VCDL 820 and a second VCDL 870), and a clock delay controller (e.g., VCDL controller) 850. As before, the power supply voltage amplitude noise detector 810 provides an amplitude noise clock delay control signal ($V_{CDC\_A}$) and the power supply voltage frequency noise detector 840 provides a frequency noise clock delay control signal ($V_{CDC\_F}$). However, the amplitude noise clock delay control signal ($V_{CDC\_A}$) is applied to both first and second VCDLs 820 and 870.

The VCDL controller 850 is configured to determine whether or not the frequency of the frequency jitter associated with the power supply voltage exceeds a defined threshold. Under a reasonable assumption that lower frequency noise components in the power supply voltage (Vp) are less deleterious to the operation of the data transfer circuit 830, only higher frequency noise components result in further adjustments (i.e., adjustment beyond those caused by amplitude jitter in the power supply voltage) to the delay applied to the input clock signal (CLK). Thus, when the frequency of noise associated with power supply voltage (Vp) is less than the threshold frequency, the VCDL controller 830 activates the first VCDL 820, which then operates in a manner analogous to the clock delay circuit of FIG. 4, for example, and deactivates the second VCDL 870, which then merely passes the delayed clock signal (D_CLK) received from the first VCDL 820 to the data transfer circuit 830. However, when the frequency of noise associated with power supply voltage (Vp) is greater than or equal to the threshold frequency, the VCDL controller 830 deactivates the first VCDL 820, which then merely passes through the input clock signal (CLK) to the second VCDL 870, and activates the second VCDL 870, which then operates in a manner analogous to the clock delay circuit of FIG. 11.

Alternately, the first VCDL 820 may be constantly used to adjust the delay applied to the input clock signal (CLK) in relation to amplitude jitter (and resulting VCDC_A), while the second VCDL 870 is optionally used (i.e., switched IN/OUT by operation of the VCDL controller 850) to further adjust the delay of the delayed clock signal (D_CLK) in relation to frequency jitter detected on the power supply voltage, if the frequency jitter has frequency that exceeds a defined threshold frequency.

In either configuration option described above in relation to FIG. 12, the first and second VCDLs may be physically arranged in relation to the data transfer circuit 830 to good effect. For example, the second VCDL 870 may be located relatively close to the data transfer circuit 830 to minimize or reduce flight time for the delayed clock signal (D_CLK) in view of high frequency noise components apparent in the power supply voltage (Vp). Where circuit (or printed circuit board) layout space close to the data transfer circuit 830 comes at a premium, at least the first VCDL 820 (or earlier stage VCDLs, where more than two VCDLs are used) may be remotely located from the data transfer circuit 830 without material loss of noise compensation capabilities.

Figure 13A:
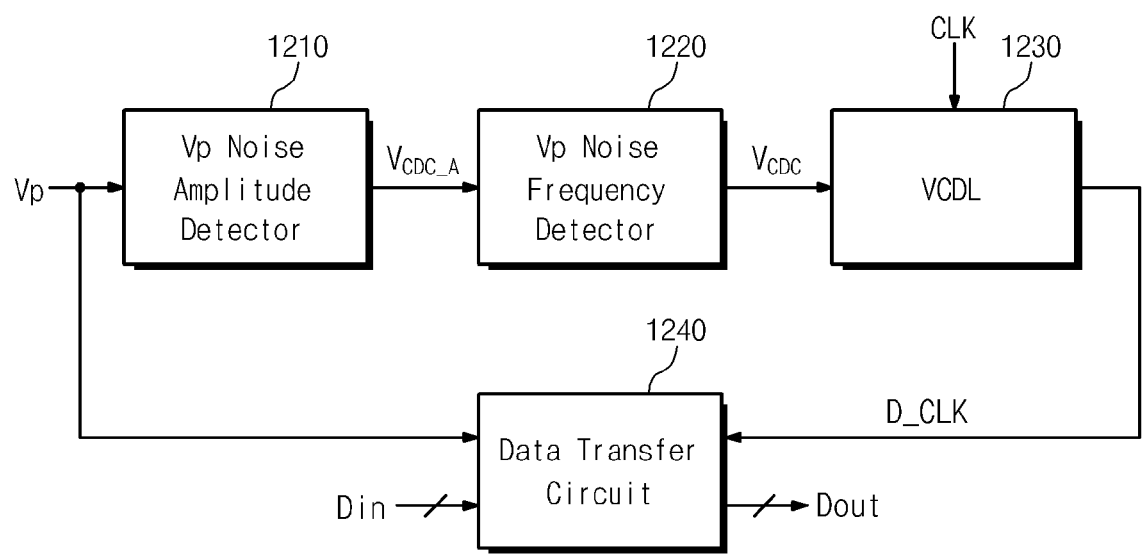
FIG. 13a is a circuit diagram illustrating the combination of a power supply voltage noise detector and related voltage controlled delay line susceptible to incorporation within an embodiment of the inventive concept.
Figure 13B:
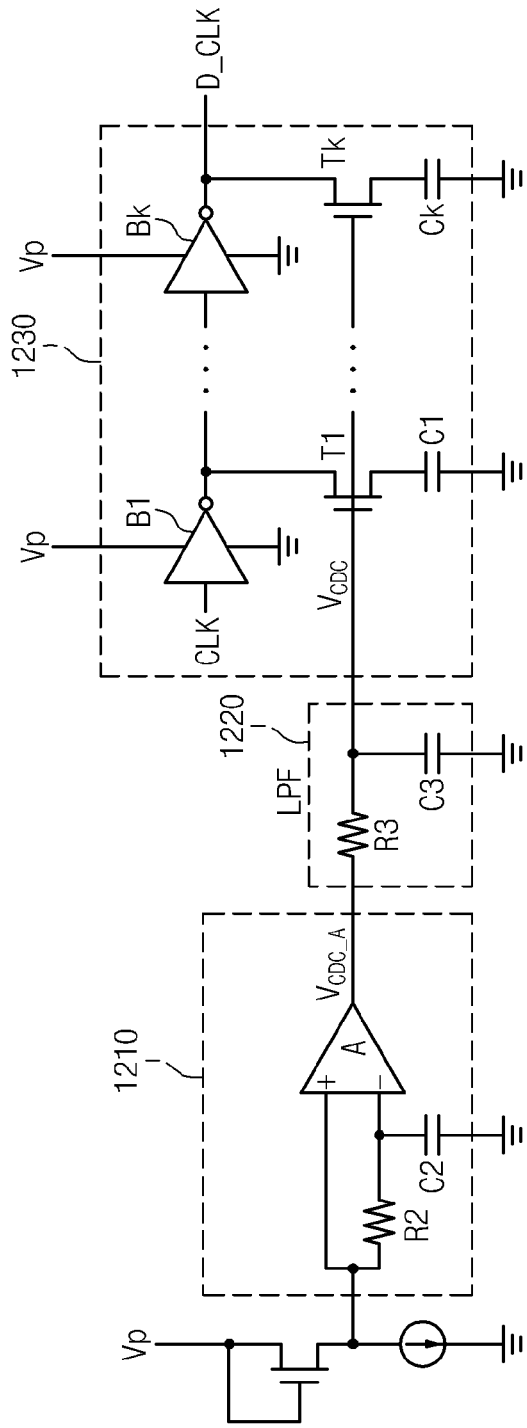
Figure 13C:
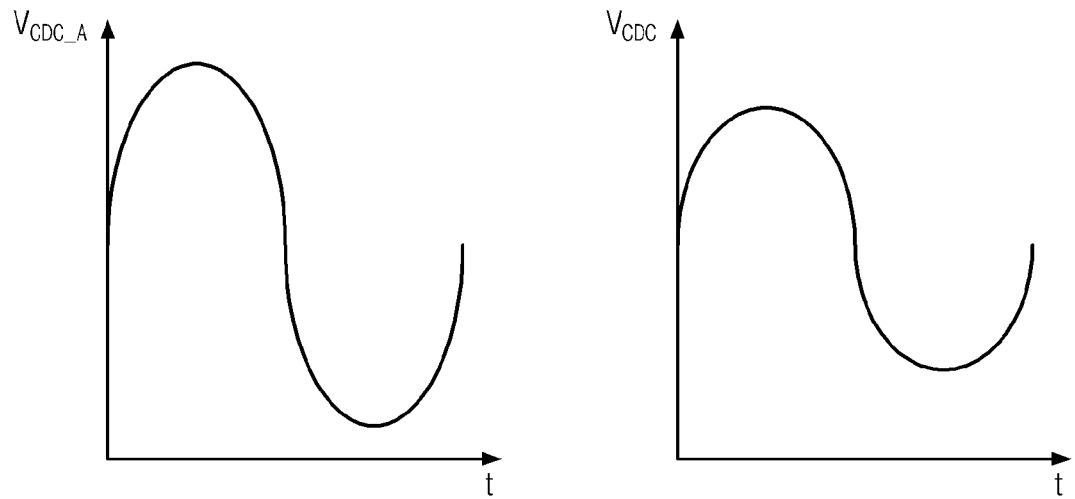
Figure 13C:
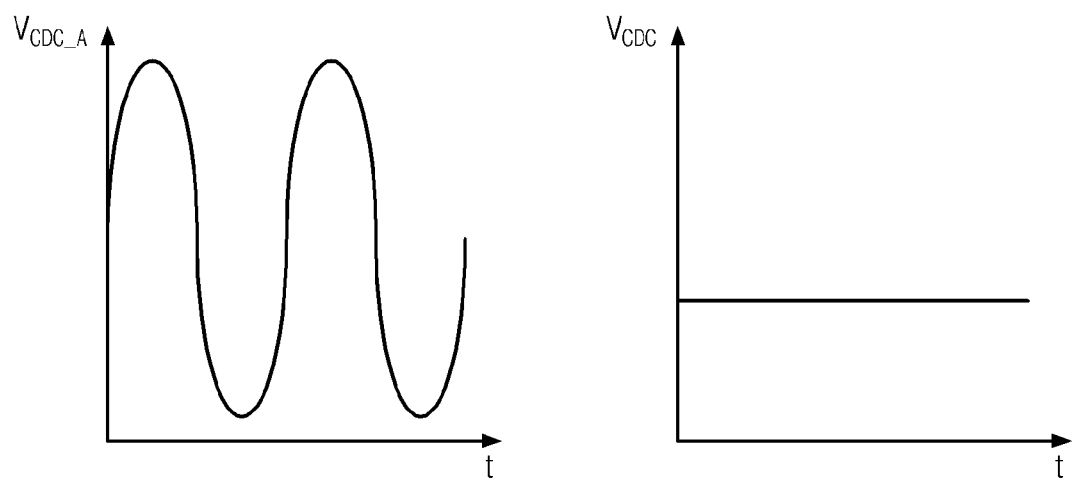

FIG. 13, inclusive of FIGS. 13a, 13b and 13c, illustrates yet another embodiment of the inventive concept including both a power supply voltage amplitude noise detector 1210 and a power supply voltage frequency noise detector 1220. As before, the power supply voltage amplitude noise detector 1210 receives the power supply voltage (Vp) and generates the amplitude noise clock delay control signal ($V_{CDC\_A}$). However, instead of configuring the power supply voltage amplitude noise detector 1210 and the power supply voltage frequency noise detector 1220 in parallel as shown in the embodiment of FIG. 11, the embodiments of FIG. 13 apply the noise frequency detection function to the amplitude noise clock delay control signal ($V_{CDC\_A}$) provided by the power supply voltage amplitude noise detector 1210, instead of applying the noise frequency detection function directly to the power supply voltage (Vp). In this manner, a single clock delay control signal ($V_{CDC}$) incorporating both amplitude noise and frequency noise detection components may be generated to control the operation of VCDL 1230 receiving the clock signal (CLK) and generating an appropriately jittered (preconditioned) delayed clock signal (D_CLK) subsequently applied to the data transfer circuit 1240.

As shown in some additional detail in FIG. 13*b*, the power supply voltage amplitude noise detector 1210 and the VCDL 1230 are respectively similar to the power supply voltage noise detector 210 and clock delay circuit 220 of the embodiment shown in FIG. 4*b*. However, the power supply voltage frequency noise detector 1220 is added between these two components. As a result of this configuration, the amplitude noise clock delay control signal ($V_{CDC\_A}$) provided by the power supply voltage amplitude noise detector 1210 may be converted into an effective clock delay control signal ($V_{CDC}$) applied to the VCDL 1230.

For example, in FIG. 13*b*, the power supply voltage frequency noise detector 1220 is simply implemented using a low pass filter (LPF) formed by resistor R3 and capacitor C3. With this particular configuration and as further illustrated in the upper graph of FIG. 13*c*, when the frequency (Freq) of the amplitude noise clock delay control signal ($V_{CDC\_A}$) received from the power supply voltage amplitude noise detector 1210 is less than one over $2\pi R2C3$ the amplitude noise clock delay control signal ($V_{CDC\_A}$) may be effectively applied to the gates of the transistors (T1 . . . Tk) of the VCDL 1230 as a clock delay control signal ($V_{CDC}$). In other words, operation of the VCDL 1230 is enabled when the frequency (Freq) of the amplitude noise clock delay control signal ($V_{CDC\_A}$) received from the power supply voltage amplitude noise detector 1210 is less than one over $2\pi R2C3$. However, when the frequency (Freq) of the amplitude noise clock delay control signal ($V_{CDC\_A}$) is greater than or equal to one over $2\pi R2C3$ as illustrated in the lower graph of FIG. 13*c*, the resulting clock delay control signal ($V_{CDC}$) is essentially flat (DC) and the gate voltages of the transistors (T1 . . . Tk) of the VCDL 1230 are fixed. In this second condition, when the frequency (Freq) of the amplitude noise clock delay control signal ($V_{CDC\_A}$) is greater than or equal to one over $2\pi R2C3$, the VCDL 1230 is disabled.

Figure 14A:
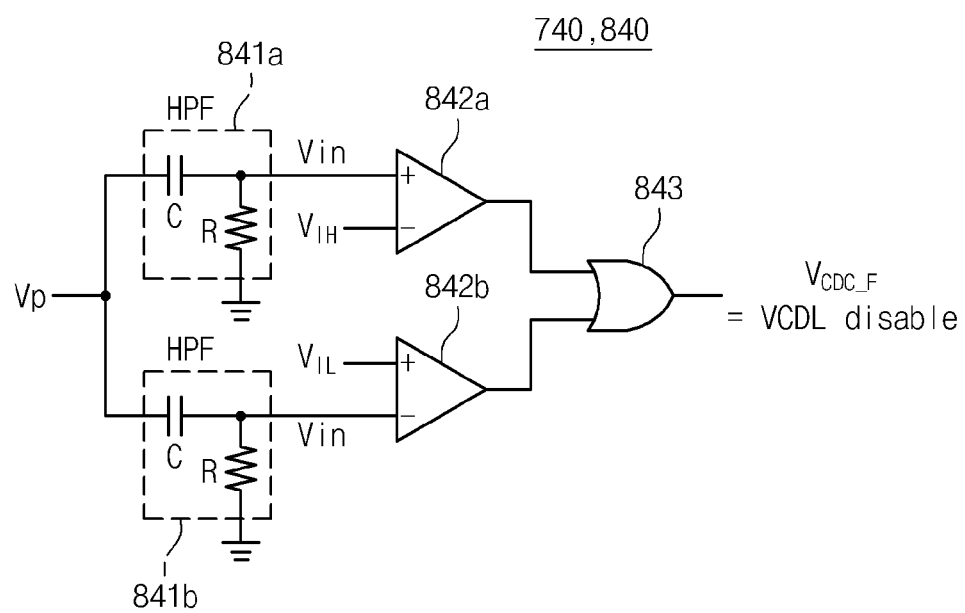
FIG. 14a is a circuit diagram illustrating one possible implementation of the power supply voltage noise frequency detector of FIGS. 11 and 12, and FIG. 14b.
Figure 14B:
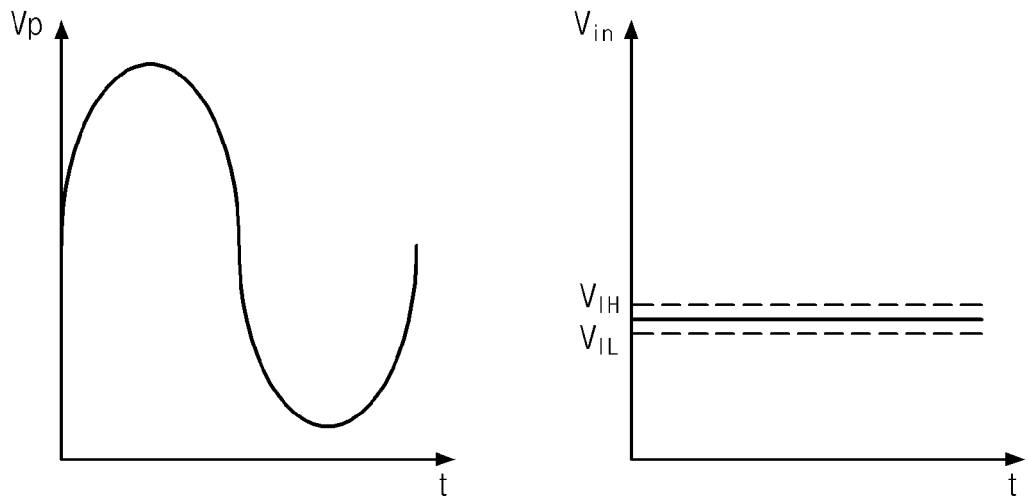
FIG. 14b is a corresponding set of signal waveform diagrams.
Figure 14B:
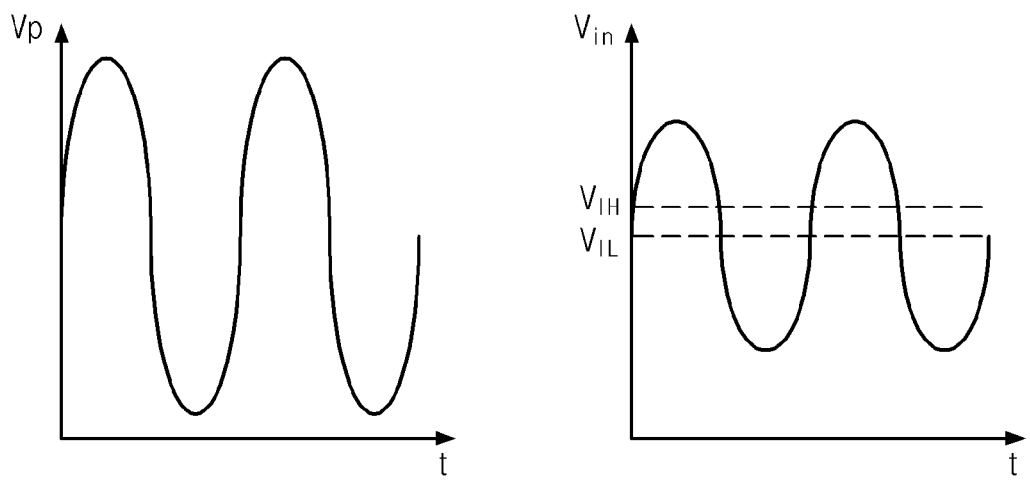

FIG. 14, inclusive of the circuit diagram FIG. 14*a* and the corresponding signal waveform diagrams of FIG. 14*b*, further illustrates one possible implementation of the power supply voltage frequency noise detector 740, 840 of FIGS. 11 and 12. The power supply voltage frequency noise detector 740, 840 illustrated in FIG. 14*a* commonly applies the power supply voltage (Vp) to dual high pass filters (HPF) 841*a* and 841*b*. Those skilled in the art will recognize that there are many different circuits that may be used to implement high pass filters 841*a* and 841*b*, but a simply RC arrangement is shown in the illustrated example of FIG. 13*a*. Each one of the dual HPFs 841*a* and 841*b* respectively provides the resulting high frequency component ($V_{IN}$) of the power supply voltage (Vp) to a corresponding differential amplifier 842*a* and 842*b*. The first HPF 841*a* applies the high frequency component ($V_{IN}$) to the first differential amplifier 842*a* as a positive input, and the second HPF 841*b* applies the high frequency component ($V_{IN}$) to the second differential amplifier 842*b* as a negative input. With this configuration, the power supply voltage frequency noise detector 740, 840 is designed to disable (e.g.,) the VCDL 720 of FIG. 11 when the frequency of the power supply voltage (Vp) noise component is higher than a defined cut off frequency. In the illustrated, for example, the cut off frequency is equal to $\frac{1}{2\pi RC}$.

As further illustrated in the upper graph of FIG. 14*b*, when the frequency (Freq) of the power supply voltage (Vp) is less than one over $\frac{1}{2\pi RC}$, the value of the high frequency component ($V_{IN}$) will be between defined upper and lower limits, $V_{IL}$ and $V_{IH}$. In such circumstances, the resulting frequency noise clock delay control signal ($V_{CDC\_F}$) provided by logic gate 843 will be "low" and VCDL 720 will be enabled in its operation. However, as further illustrated in the lower graph of FIG. 14*b*, when the frequency (Freq) of the power supply voltage (Vp) is greater than or equal to one over $\frac{1}{2\pi RC}$, the value of the high frequency component ($V_{IN}$) will be outside the range between the upper and lower limits, $V_{IL}$ and $V_{IH}$. In such circumstances, the resulting frequency noise clock delay control signal ($V_{CDC\_F}$) provided by logic gate 843 will be "high" and VCDL 720 will be disabled in its operation. Those skilled in the art will recognize that the range established by the upper and lower limits, $V_{IL}$ and $V_{IH}$ is a matter of design choice, but in certain embodiments of the inventive concept the range between the upper and lower limits, $V_{IL}$ and $V_{IH}$ will be fairly narrow to reduce the enablement range for the VCDL 720.

Figure 15:
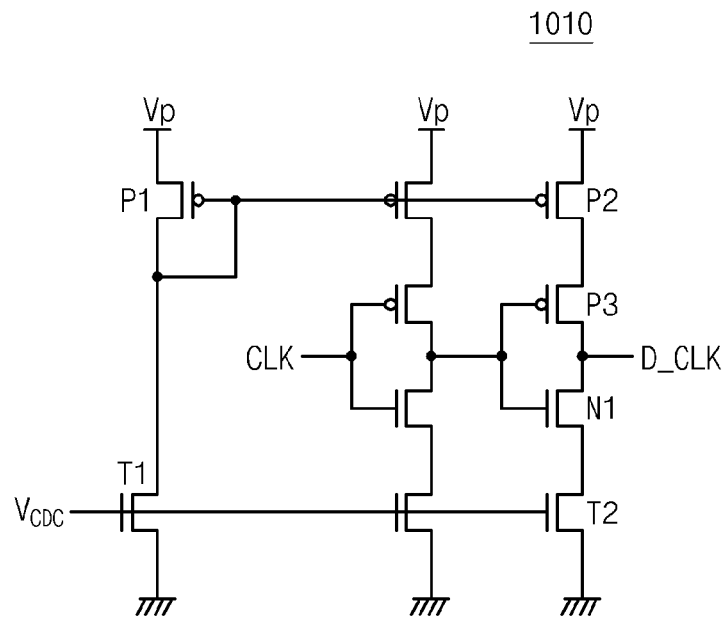
FIG. 15 is a circuit diagram illustrating a voltage controlled delay line (VCDL) susceptible to incorporation within an embodiment of the inventive concept.

FIG. 15 illustrates yet another alternate embodiment for a VCDL susceptible to incorporation within embodiments of the inventive concept. Those skilled in the art will recognize that the plurality of capacitors required by the embodiments of FIGS. 4*b*, and 13*b*, for example, is not required by the embodiment of FIG. 15. This feature generally allows denser integration of the VCDL circuit.

Figure 16:
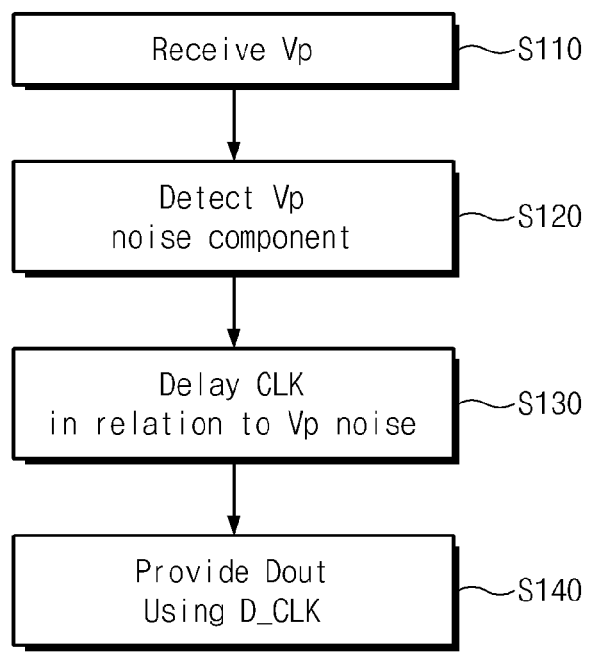
FIG. 16 is a flowchart summarizing a method of controlling the operation of a data transfer circuit according to an embodiment of the inventive concept.

FIG. 16 is a flowchart summarizing an exemplary method embodiment of the inventive concept. The method begins by receiving, per any one of the foregoing circuit embodiments, a power supply voltage (Vp) (S110), and then detecting a noise component (e.g., frequency and/or amplitude) associated with the power supply voltage (S120). The detected power supply voltage noise component is then used to define a delay applied to an input clock signal (CLK) to generate a compensating (preconditioned) delayed clock signal (D_CLK). (S130). And the delayed clock signal (D_CLK), along with the power supply voltage (Vp) and a data input signal (Din), are applied to a data transfer circuit to control the provision of output data (Dout) having the same information content as the input data (Din).

Figure 17:
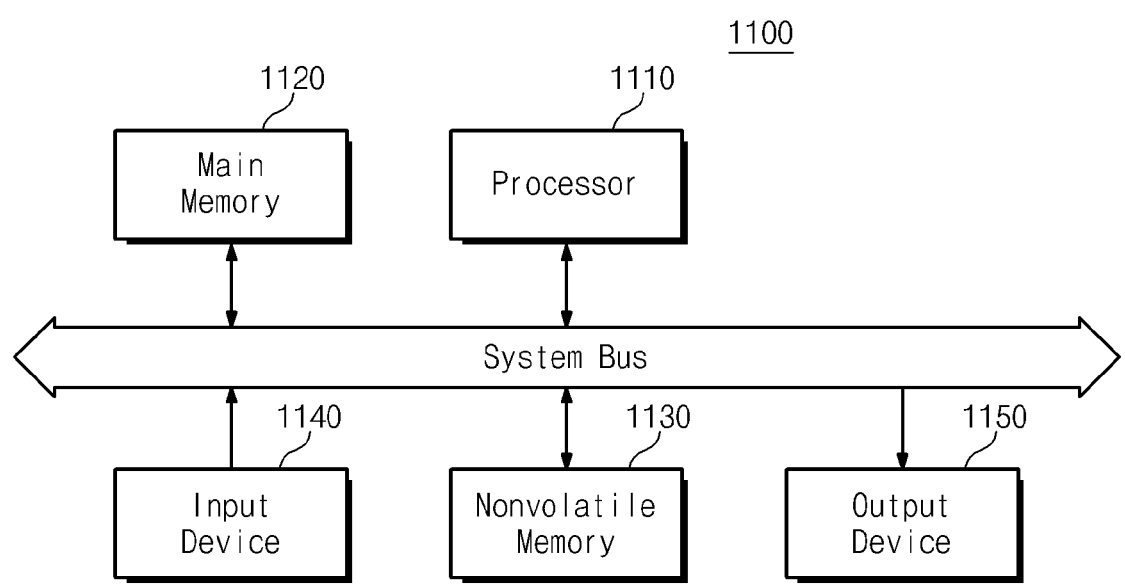
FIG. 17 is a computational system incorporating at least one integrated circuit incorporating a data transfer circuit controlled in its operation according to an embodiment of the inventive concept.

The method and circuit embodiments of the inventive concept may be readily incorporated within various integrated circuit devices and systems. FIG. 17 illustrates one general example of a computational system 1100 including one or more integrated circuit devices including at least one data transfer circuit in accordance with an embodiment of the inventive concept. The computational system of FIG. 16 comprises a processor 1110, a main memory 1120, an input device 1140 (e.g., a keypad), non-volatile memory 1130, and an output device (e.g., a display) 1150 connected via a system bus 1160. One or both of the main memory 1120 and the non-volatile memory 1130 may be implemented using a plurality of memory devices. In certain systems, this plurality of memory devices may be functionally arranged on a memory card (e.g., a printed circuit board physically mounting and operatively connecting a plurality of memory devices).

Multiple data channels (e.g., signal lines) may be included within the system bus 1160, and one or more the components (e.g., the processor 1110, main memory 1120, input device 1140, non-volatile memory 1130, and output device 1150) connected to a data channel may incorporate to good advantage a data transfer circuit according to an embodiment of the inventive concept. In fact, a parallel collection of data transfer circuits may be used as part of a data I/O interface for at least the processor 1110, main memory 1120, and non-volatile memory 1130 in order to operatively facilitate the exchange of data via multiple data channels.

Figure 18:
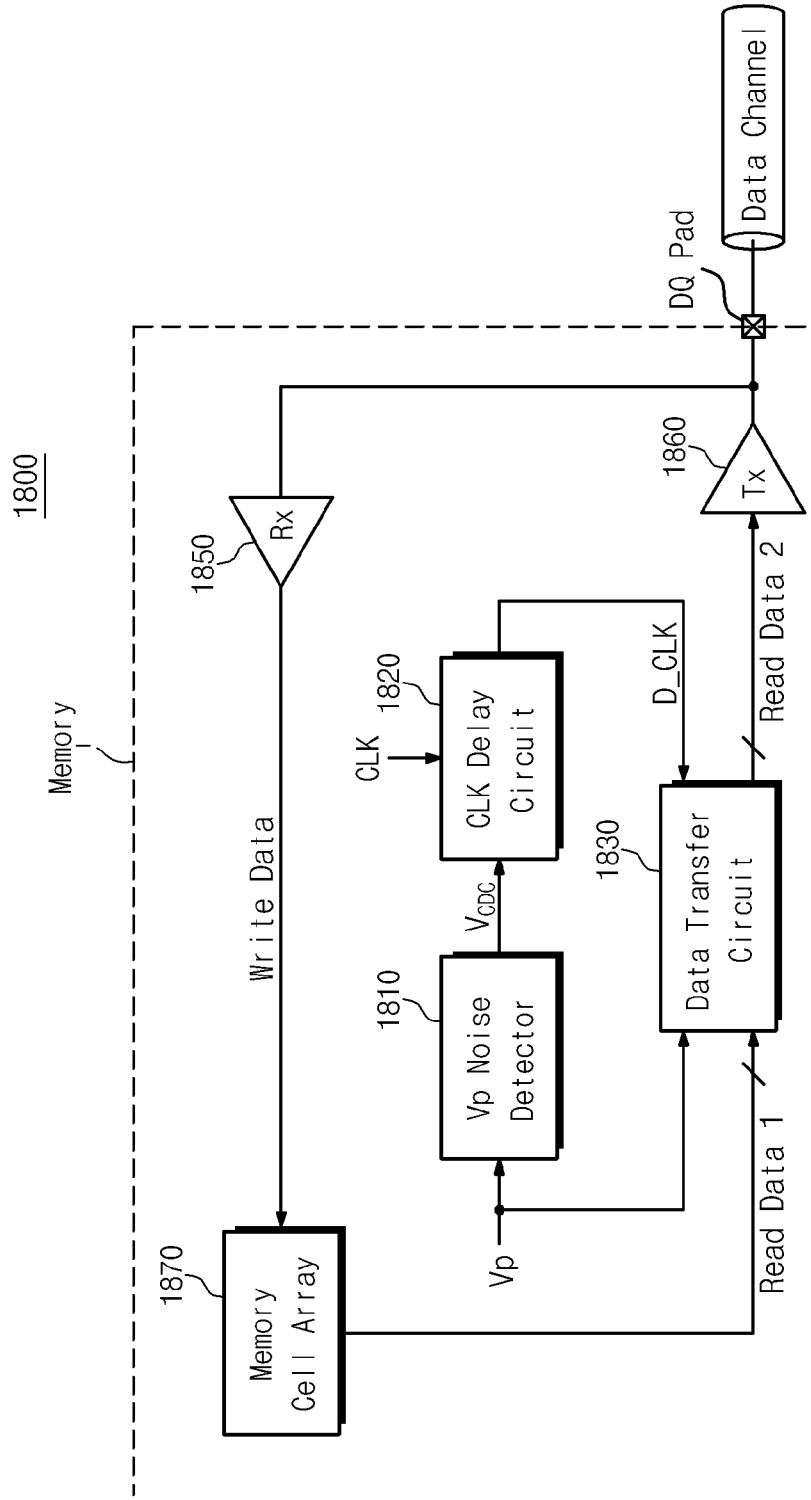
FIG. 18 is a semiconductor memory device incorporating at least one data transfer circuit controlled in its operation according to an embodiment of the inventive concept.

FIG. 18 illustrates an embodiment of the inventive concept configured as a semiconductor memory device 1800. As is conventionally understood, the memory device 1800 comprises a memory cell array 1870 accessed via receive/transmit circuitry 1850/1860. The receive circuitry (Rx) 1850 provides "write data" to be stored in the memory cell array 1870 using conventionally understood techniques. The transmit circuitry (Tx) 1860 generally provides output data (Dout) in the form (e.g.) of "read data" to an external data channel using conventionally understood techniques, except consistent with embodiments of the inventive concept the read data is provided using a power supply voltage noise detector 1810, a clock delay circuit 1820, and a data transfer circuit 1830 operating in conjunction with the transmit circuitry (Tx) 1860.

In effect, "read data 1" retrieved from the memory cell array 1870 is re-timed (potentially among other signal processing functions) and output by the data transfer circuit 1830 as "read data 2" to the transmit circuitry 1860. It should be noted, however, that read data 1 and read data 2 have the same data content, but the timing of the data is changed, as needed, by the data transfer circuit 1830 according to embodiments of the inventive concept.

While exemplary embodiments of the inventive concept have been particularly shown and described above, it is understood that various changes in form and detail may be made therein without departing from the scope of the following claims. Further, those skilled in the art will recognize that the teaching embodiments presented above may be extended to the input portion of a data I/O interface. That is, the data transfer circuits described above have been used in relation to data output circuits. In similar manner, however, variations in a power supply voltage applied to the circuits forming a data input circuit may cause data errors. Accordingly, certain embodiments of the inventive concept may be applied to data input circuits as well as data output circuits. Other embodiments of the inventive concept may further include conventionally understood circuits protecting a data I/O interface from electro-static discharge (ESD) and/or electro-magnetic interference (EMI).

What is claimed is:

1. A method of operating a data transfer circuit, comprising:
   receiving a power supply voltage powering the data transfer circuit and detecting a power supply voltage noise component of the power supply voltage;
   generating a clock delay control signal in response to detected power supply voltage noise component;
   receiving a clock signal and delaying the clock signal in response to the clock delay control signal to generate a delayed clock signal; and
   receiving input data in the data transfer circuit and providing output data corresponding to the input data synchronously with the delayed clock signal.

2. The method of claim 1, wherein the power supply voltage noise component is at least one of an amplitude noise component corresponding to amplitude variations in the power supply voltage, and a frequency component corresponding to frequency of noise associated with the power supply voltage.

3. The method of claim 2, wherein generating the clock delay control signal comprises:
   filtering the power supply voltage to obtain a power supply voltage filtered noise response; and
   amplifying the power supply voltage filtered noise response to generate the clock delay control signal.

4. The method of claim 2, wherein delaying the clock signal comprises passing the received clock signal through a voltage controlled delay line applying a delay determined in response to the clock delay control signal.

5. The method of claim 4, wherein the voltage controlled delay line comprises a plurality of series connected inverters arranged between an input receiving the clock signal and an output providing the delayed clock signal, and a plurality of transistors having different threshold voltages, each transistor having a gate connected to a control voltage to operatively connect/disconnect a capacitor to one inverter in the plurality of inverters in response to the control voltage, and
   the power voltage delay signal is the control voltage.

6. The method of claim 5, wherein the noise detector comprises:
   a transistor connected as a source follower, receiving the power supply voltage and providing a source voltage;
   a current source connected between the source voltage and ground;
   a differential amplifier having a first terminal receiving the source voltage and a second terminal receiving a low-pass filtered version of the source voltage, and
   generating the clock delay control signal comprises generating the control voltage applied to the plurality of transistors.

7. The method of claim 1, wherein the data transfer circuit is a plurality of data transfer circuits, each one of the plurality of data transfer circuits receiving respective input data and providing corresponding output data, each being powered by the power supply voltage, and each providing the corresponding output data synchronously with the delayed clock signal.

8. The method circuit claim 7, wherein the clock delay circuit is a plurality of clock delay circuits, each one of the plurality of clock delay circuits being operatively associated with one of the plurality of data transfer circuits to provide the one data transfer circuit with a respective delayed clock signal, such that the output data provided by each one of the plurality of data transfer circuits is provided synchronously with the respective delayed clock signal.

9. The method of claim 8, wherein each one of the plurality of clock delay circuits is a voltage controlled delay line receiving the clock signal and providing the respective delayed clock signal in response to the clock delay control signal.

10. The method of claim 1, wherein the clock delay circuit comprises a plurality of series connected voltage controlled delay lines receiving the clock signal and providing the delayed clock signal in response to the clock delay control signal.

11. The method of claim 10, wherein the data transfer circuit is a plurality of data transfer circuits, each one of the plurality of data transfer circuits receiving respective input data and providing corresponding output data, each being powered by the power supply voltage, and each providing the corresponding output data synchronously with the delayed clock signal.

12. The method of claim 11, wherein each one of the plurality of series connected voltage controlled delay lines provides a respective delayed clock signal to one of the plurality of the data transfer circuits, such that the output data provided by each one of the plurality of data transfer circuits is provided synchronously with the respective delayed clock signal.

13. The method of claim 1, wherein the power supply voltage noise component is a frequency component corresponding to frequency variations in the power supply voltage.

14. The method of claim 1, wherein detecting the power supply voltage noise comprises receiving the power supply voltage in a power supply voltage amplitude noise detector providing a first clock delay control signal corresponding to amplitude variation in the power supply voltage, and receiving the power supply voltage in a power supply voltage frequency noise detector providing a second clock delay control signal corresponding to frequency variations in the power supply voltage; and delaying the clock signal comprises delaying the clock signal in response to at least one of the first and second clock delay control signals to generate the delayed clock signal.

15. The method of claim 14, wherein delaying the clock signal further comprises in a first voltage controlled delay circuit receiving the clock signal and the first clock delay control signal, and providing a first delayed clock signal in response to the first power supply voltage signal, and in a second voltage controlled delay circuit receiving the first delayed clock signal and the second clock delay control signal, and providing a second delayed clock signal in response to the second power supply voltage signal, wherein the second delayed clock signal is the delay clock signal applied to the data transfer circuit.

16. The method of claim 15, wherein delaying the clock signal further comprises turning ON the second voltage controlled delay line when the frequency variations in the power supply voltage rises to a defined threshold.

\* \* \* \* \*